(12) United States Patent
Schmidt

(10) Patent No.: US 8,735,981 B2
(45) Date of Patent: May 27, 2014

(54) TRANSISTOR COMPONENT HAVING AN AMORPHOUS SEMI-ISOLATING CHANNEL CONTROL LAYER

(75) Inventor: Gerhard Schmidt, Wernberg (AT)

(73) Assignee: Infineon Technologies Austria AG, Villach (AT)

( * ) Notice: Subject to any disclaimer, the term of this patent is extended or adjusted under 35 U.S.C. 154(b) by 35 days.

(21) Appl. No.: 12/486,471

(22) Filed: Jun. 17, 2009

(65) Prior Publication Data

US 2010/0320536 A1 Dec. 23, 2010

(51) Int. Cl.
*H01L 29/66* (2006.01)

(52) U.S. Cl.
USPC ............ 257/337; 257/339; 257/409; 257/52; 257/57; 257/77; 257/327

(58) Field of Classification Search
USPC ............... 257/339, 409, 52, 57, 77, 337, 327
See application file for complete search history.

(56) References Cited

U.S. PATENT DOCUMENTS

| | | | | | |
|---|---|---|---|---|---|
| 4,270,137 | A | * | 5/1981 | Coe | 257/408 |
| 4,800,415 | A | * | 1/1989 | Simmons et al. | 257/26 |
| 5,710,455 | A | * | 1/1998 | Bhatnagar et al. | 257/472 |
| 6,455,892 | B1 | * | 9/2002 | Okuno et al. | 257/328 |
| 6,462,377 | B2 | | 10/2002 | Hurkx et al. | |
| 7,053,400 | B2 | | 5/2006 | Sun et al. | |
| 7,439,594 | B2 | * | 10/2008 | Mouli | 257/390 |
| 8,513,081 | B2 | | 8/2013 | Guo et al. | |
| 2003/0042535 | A1 | * | 3/2003 | Saito et al. | 257/327 |
| 2005/0269660 | A1 | * | 12/2005 | Singh | 257/492 |
| 2005/0280114 | A1 | * | 12/2005 | Singh | 257/502 |
| 2006/0043379 | A1 | * | 3/2006 | Zhang et al. | 257/77 |
| 2006/0197156 | A1 | | 9/2006 | Amaratunga et al. | |
| 2007/0001243 | A1 | * | 1/2007 | Kizilyalli et al. | 257/411 |
| 2009/0008723 | A1 | * | 1/2009 | Schmidt | 257/409 |
| 2009/0050900 | A1 | * | 2/2009 | Masuda | 257/77 |
| 2011/0073873 | A1 | * | 3/2011 | Kikkawa et al. | 257/77 |
| 2011/0084284 | A1 | * | 4/2011 | Zhang et al. | 257/77 |

FOREIGN PATENT DOCUMENTS

| | | |
|---|---|---|
| DE | 11 2005 001 029 | 2/2007 |
| DE | 10 2012 218 580 | 4/2013 |
| EP | 0400178 B1 | 8/1994 |

OTHER PUBLICATIONS

Heywang, "Amorphe and polykristalline Halbleiter", including English translation, 1984.
Yano et al., "High Channel Mobility in Inversion Layer of SiC MOSFETs for Power Switching Transistors", Jpn. J. Appl. Phys. vol. 39, 2000, pp. 2008-2011.
He et al., "Investigation of Si-doped diamond-like carbon films synthesized by plasma immersion ion processing", J. Vac. Sci. Technol. A 18(5), Sep./Oct. 2000, pp. 2143-2148.
Allon-Alaluf et al., "Metal contacts and electrical processes in amorphous diamond-like carbon films", Diamond and Related Materials 5, 1996, 1275-1281.
Sze, "Semiconductor Devices—Physics and Technology" 2nd Edition, 1985 (2 pgs.).

(Continued)

*Primary Examiner* — Fernando L Toledo
*Assistant Examiner* — Mohammed Shamsuzzaman
(74) *Attorney, Agent, or Firm* — Dicke, Billig & Czaja, PLLC

(57) ABSTRACT

Disclosed is a transistor component having a control structure with a channel control layer of an amorphous semiconductor insulating material extending in a current flow direction along a channel zone.

22 Claims, 10 Drawing Sheets

(56) References Cited

OTHER PUBLICATIONS

Robertson, "The electronic and atomic structure of hydrogenated amorphous Si-C alloys", Philosophical Magazine B, 1992, vol. 66, No. 5, 615-638.

Kanicki, "Properties of Metal/Hydrogenated Amorphous Silicon Interfaces", Spring Edition 1987, pp. 189-282.

Evtukh et al., "Silicon Doped Diamond-Like Carbon Films as a Coating for Improvement of Electron Field Emission", Proceedings of the 14th International Vacuum Microelectronics Conference, Aug. 12-16, 2001, pp. 295-296.

Dasgupta et al., "Bands and gap states from optical absorption and electron-spin-resonance studies on amorphous carbon and amorphous hydrogenated carbon films", Physical Review B, vol. 43, No. 3, Jan. 15, 1991, pp. 2131-2135.

Cherkashinin et al., "Mobility edge in hydrogenated amorphous carbon", Applied Physics Letters 88, 172114, 2006 pp. 1-3.

Chew et al., "Gap state distribution in amorphous hydrogenated silicon carbide films deduced from photothermal deflection spectroscopy", Journal of Applied Physics, vol. 91, No. 7, Apr. 1, 2002, pp. 4319-4325.

Redmann, "Untersuchung von Siliziumkarbidkristallen mit Hilfe der Positronen-Annihilations-Spektroskopie" (Dissertation); Martin-Luther-Universitaet Halle-Wittenberg, Jul. 4, 2003.

Ruff et al., "SiC Devices: Physics and Numerical Simulation", IEEE Transactions on Electron Devices, vol. 41, No. 6, Jun. 1994, pp. 1040-1054.

Scharmann, "Siliziumcarbid-Bildung auf Silizium unter den Bedingunger der Molekularstrahlepitaxie", Universitaet Ilmenau, May 15, 2001.

NSM Archive—Physical Properties of Semiconductors: http://ioffe.sssi.ru/SVA/NSM/semicond/SiC/index.html, 1996.

\* cited by examiner

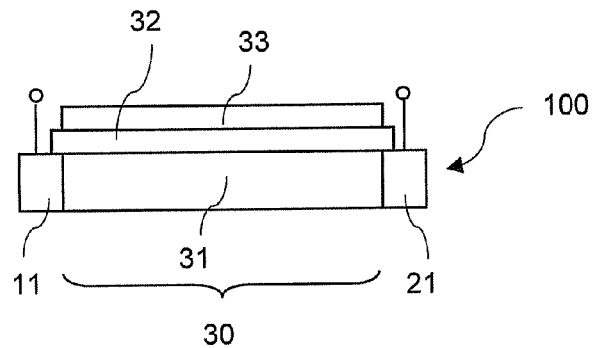
FIG 1
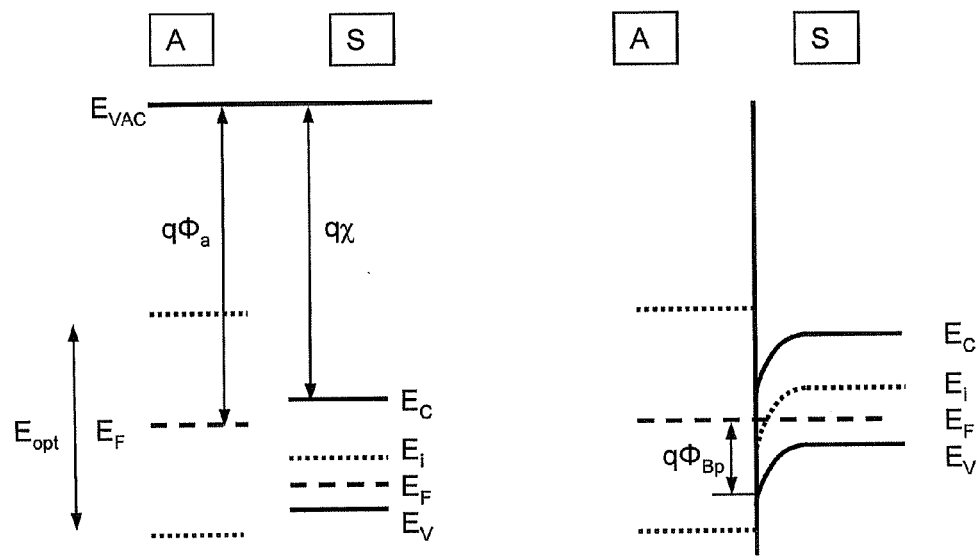
FIG 2A
FIG 2B
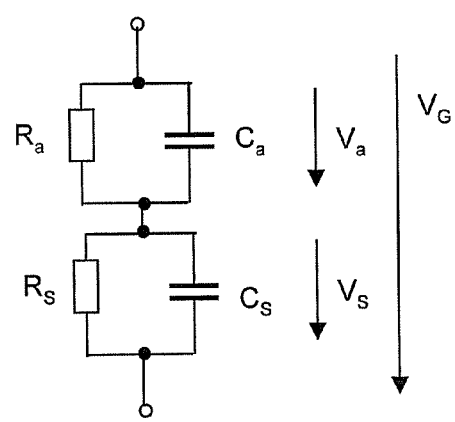
FIG 3

TRANSISTOR COMPONENT HAVING AN AMORPHOUS SEMI-ISOLATING CHANNEL CONTROL LAYER

TECHNICAL FIELD

One aspect relates to a transistor component, in one embodiment a field-effect transistor.

BACKGROUND

MOS transistors, such as MOSFET or IGBT, include a control structure by which the component is controllable, such as adapted to be switched on and off. This control structure includes a gate electrode of an electrically conducting material and being insulated against a body zone of the MOS transistor by a dielectric layer, or the gate dielectric. The body zone is arranged between a source zone and a drain zone (which are also referred to as emitter zone and collector zone in an IGBT), where in power MOS transistors a drift zone is arranged between the drain zone and the body zone, with the drift zone being lowly doped compared to the drain zone.

The gate electrode serves for controlling a conducting channel in the body zone along the gate dielectric. Dependent on the component this channel is an accumulation or inversion channel. The MOS transistor is controlled by applying an electrical potential (gate potential) to the gate electrode or by applying an electrical voltage (gate voltage) between the gate electrode and the source zone, respectively. The absolute value of the gate voltage to be applied for effecting a conducting channel in the body zone and the polarity of this gate voltage is dependent on the type of the transistor.

In power semiconductor components having a voltage blocking capability of several 100V up to several kV a significant voltage is present across the gate dielectric when the component blocks or is switched off. The dielectric strength of this gate dielectric layer influences the voltage blocking capability of the overall component. In general the strength of the gate dielectric layer may be increased by increasing its layer thickness. However, higher gate voltages for controlling the component are required when increasing the layer thickness.

The gate dielectric layer is, e.g., a semiconductor oxide, such as silicon oxide in a silicon component. At field strengths that lie above about 6 MV/cm a Fowler-Nordheim-tunneling-current over the oxide layer sets in. The breakthrough field-strength is about 10 MV. In use of a component field-strengths higher than 4 MV/cm should be avoided in order to avoid degradation. This maximum allowable field-strength limits the allowable gate voltage, and therefore limits the charge density that can settle in in the conducting channel along the gate dielectric in the body zone.

Further, the gate dielectric may degrade due to temperature induced mechanical stress, cosmic radiation, or injection of hot charge carriers, the latter occurring during avalanche breakthrough of a MOSFET, e.g.

For these and other reasons there is a need for the present invention.

ABSTRACT

An aspect of the present disclosure relates to a semiconductor component, including: a first and a second connection zone arranged distant to one another; a control structure having a channel zone of a first conductivity type that is arranged between the first and the second connection zone, a channel control layer of an amorphous semi-insulating material extending in a current flow direction along the channel zone, and a control electrode.

BRIEF DESCRIPTION OF THE DRAWINGS

In the following examples will be illustrated in detail with reference to drawings. These drawings serve to explain the basic principle, so that only those features necessary for understanding the basic principle are illustrated in the drawings. In the drawings, unless stated otherwise, same reference characters denote the same features with the same meaning.

FIG. 1 illustrates by a cross section through a semiconductor body a transistor component having a control structure according to a first embodiment, the control structure having an amorphous semi-insulating channel control layer.

FIG. 2 illustrates by a band diagram the operating principle of the amorphous semi-insulating channel control layer.

FIG. 3 illustrates the equivalent circuit diagram of the amorphous semi-insulating channel control layer, and the junction between the amorphous semi-insulating channel control layer and the channel zone.

DETAILED DESCRIPTION OF THE DRAWINGS

Figure 4:
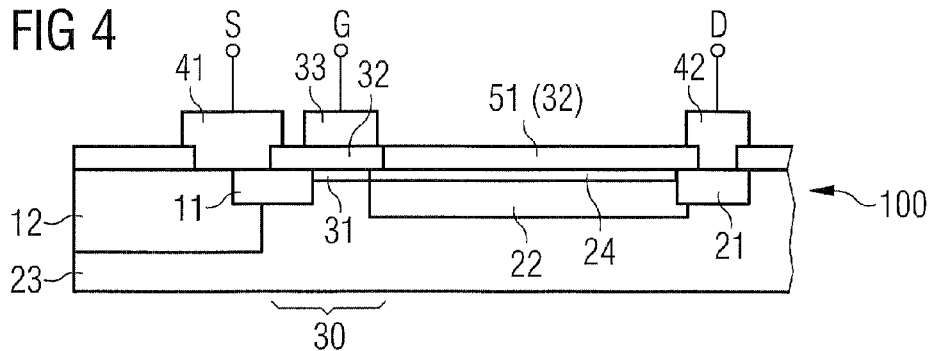
FIG. 4 illustrates an embodiment of a lateral power transistor component.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The present disclosure relates to concepts of a control structure of a transistor component. This concept may be used in a plurality of different components that will be explained in the following. With reference to FIGS. 1 and 2 a first concept will be illustrated first.

Referring to FIG. 1, for explanation of this concept a transistor component having a first and a second connection zone 11, 21, and a control structure 30 is examined. The control structure 30 includes a channel zone 31 arranged between the first and the second connection zone 11, 21, a channel control layer 32 extending along the channel zone 31 in a current flow direction, and a control electrode 33.

The control structure serves for controlling an electrically conducting channel, in one embodiment an inversion channel, between the first and the second connection zones 11, 21, where the component conducts or is switched on when there is such conducting channel, and where the component blocks or is switched off when there is no such conducting channel. The current flow direction corresponds to the direction in which a current between the first and the second connection zones 11, 21 flows through the channel zone 31 when the component is conducting. In this connection the current flow direction is dependent on the arrangement of the first and second connection zones 11, 21 in the semiconductor body 100. In the component illustrated in FIG. 1 the first and the second connection zones 11, 21 are, e.g., arranged distant to one another in a lateral direction of the semiconductor body, so that the current flow direction corresponds to a lateral direction of the semiconductor body 100.

In the component illustrated the channel control layer 32 is arranged between the channel zone 31 and the control electrode 33, where the channel control layer 32 may directly contact the channel zone 31, and the control electrode 33 may directly contact the channel control layer 32. The control electrode 33 is an electrically conducting material. This material is, e.g., a metal, such as aluminum, titanium or copper, a metal alloy, such as an aluminum-silicon-copper-alloy, or a multi-layer metal structure having layers of titanium, platinum and gold, e.g., or a highly doped polycrystalline semiconductor material, such as polysilicon.

The channel control layer 32 is of an amorphous semi-insulating material. Semi-insulating amorphous materials are generally known. Examples of such materials are amorphous silicon (aSi) that may be undoped or that may be doped with hydrogen (aSi:H), amorphous silicon carbide ($aSi_{1-x}C_x$) that may be undoped or that may be doped with hydrogen (($aSi_{1-x}C_x$:H), diamond like carbon (DLC) that may be undoped or that may be doped with hydrogen, silicon or nitrogen, or semi-insulating polysilicon SIPOS). Further examples of amorphous semi-insulating layers are metal doped carbon layers, that may additionally include hydrogen. Further suitable dopants for amorphous semi-insulating layers are, e.g., fluorine (F), oxygen (O), boron (B), etc.

Layers of such semi-insulating amorphous materials may be produced, e.g., by vapor deposition or by chemical vapor deposition (CVD). Pure DLC layers, silicon doped DLC layers or amorphous SiC layers may, e.g., be produced by a plasma supported CVD from precursor gases, such as silane or methane. A silicon doped DLC layer, like an amorphous $Si_{1-x}C_x$ layer, includes carbon and silicon as chemical elements, a DLC layer being characterized by a diamond-like basic structure that may be obtained by suitably selecting the deposition conditions.

By the gas flows of the precursors in a DLC layer the silicon doping or in an amorphous $Si_{1-x}C_x$-layer the mixing ratio x of silicon (Si) and carbon (C) can be set. The channel control layer 32 is, in one embodiment, an amorphous $Si_{1-x}C_x$ layer having a higher C proportion compared to the Si proportion, i.e. an amorphous $Si_{1-x}C_x$ layer with x>0.6.

Further, the channel control layer 32 is, e.g., selected such that its specific resistance is in the range of about $10^{12}$ Ωcm, i.e. between $10^{11}$ Ωcm and $10^{13}$ Ωcm. This applies to the case in which no high voltage—e.g. in the range of several volts—is applied at the channel control layer 32. As it will be explained in the following, due to the Poole-Frenkel-emission, that sets in for higher field-strengths, the specific resistance of an amorphous semi-insulating layer is dependent on the field-strength in the amorphous semi-insulating layer.

A layer thickness of the amorphous semi-insulating channel control layer is, e.g., in the range between 50 nm and 1000 nm, in one embodiment between 100 nm and 500 nm.

In order to obtain a good electrical connection of the channel control layer 32 to the channel zone 31 the contact surface, which is the surface of the channel zone 31 on which the amorphous layer is arranged, may be cleaned beforehand. For this a plasma etching, using, e.g., fluorine ions, or sputtering the surface with inert gas ions is suitable, e.g.

The work function of the amorphous semi-insulating channel control layer 32 and the doping type and the doping concentration of the channel zone 31 are adapted to one another such that an inversion channel may develop in the channel zone 31 along the channel control layer 32 controlled by the control electrode 33. As it is well known the work function of an amorphous semi-insulating layer may be set by the choice of the deposition conditions during the production, such as work pressure, HF power during the deposition, amount of gas flow, composition, and the plasma potential (self-bias) resulting from the chamber geometry, and by its doping. As it will be explained in the following, the work function determines the suitability of the channel control layer 32 together with the control electrode 33 to effect an inversion channel in the channel zone 31 along the channel control layer 32.

The specific resistance of the amorphous semi-insulating channel control layer may also be set by the deposition conditions. For example, by reducing the HF power, resulting in a reduced self-bias, the specific resistance may be increased. Further, the specific resistance is dependent on the composition. In an amorphous $Si_{1-x}C_x$ layer the specific resistance increases with increasing Si proportion.

As it will be explained in the following, the work function of the material of the channel control layer 32 and the doping concentration of the channel zone 31 can be adapted to one another such that only by the presence of the channel control layer 32 an inversion channel develops along the channel zone, without the need for a control electrode 33. However, the inversion channel of such component without control electrode cannot be controlled. The possibility of controlling the component is achieved with the help of the control electrode. In a normally-on component, i.e. in a component having a normally-on behaviour, the work function of the channel control layer 32 and the doping concentration of the channel zone 31 are adapted to one another such that an inversion channel develops at a control voltage of 0V between the control electrode 33 and the channel zone 31. In a normally-off component, i.e. a component having a normally-off behaviour, the work function of the channel control layer 32 and the doping concentration of the channel zone 31 are adapted to one another such that an inversion channel develops only at a control voltage having an absolute value higher than 0.

For a better understanding of the mechanisms that result in the development of an inversion channel in the channel zone 31 induced by the channel control layer 32 will be illustrated first. For this illustration let it first be assumed that there is no influence due to the control electrode 33, i.e. that the control voltage is 0. In this connection it should be mentioned that the following explanations apply independently of the used semiconductor material, these explanations do therefore apply to silicon (Si), gallium arsenide (GaAs), silicon carbide (SiC), or any other semiconductor material.

First the case is examined that an inversion channel should develop either in a p-doped or in an n-doped channel zone only induced by the channel control layer 32. In a p-doped channel zone 33 the inversion channel is an electron channel (n-channel), and in an n-doped channel zone 30 the inversion channel is a hole channel (p-channel). For developing an inversion channel in a p-doped channel zone 31 a surface potential or contact potential, respectively, has to be present which is at least:

$$\psi_s(inv) = \frac{2kT}{q} \ln\left(\frac{N_A}{n_i}\right) \quad (1a)$$

(see: Sze: "Semiconductor Devices", 2nd edition, John Wiley and Sons, 2002, page 175). Here, k denotes the Boltzmann constant, T the absolute temperature, q the elementary charge, $N_A$ the acceptor concentration (p-doping), and $n_i$ the intrinsic concentration.

Equivalently in an n-doped drift zone a surface potential has to be present for developing an inversion channel, which is at least:

$$\psi_s(inv) = \frac{2kT}{q} \ln\left(\frac{N_D}{n_i}\right) \quad (1b)$$

Here, $N_D$ denotes the donator concentration in the drift zone.

The barrier height $q\Phi_{Bp}$ of a p-doped semiconductor material is the sum of the contact potential and the difference $E_F-E_V$ between the Fermi level $E_F$ and the energy level $E_V$ of the valence band. It therefore applies:

$$q\Phi_{Bp}=q\psi_s+E_F-F_V \quad (2a)$$

Equivalently, in an n-doped semiconductor material the barrier height $q\Phi_{Bp}$ is the sum of the contact potential $q\Psi_s$ and the difference $E_C-E_F$ between the energy level $E_C$ of the conduction band and the Fermi level $E_F$. It therefore applies:

$$q\Phi_{Bn}=q\psi_s+E_C-E_F \quad (2b)$$

In equations (2a) and (2b) $\Psi_S$ generally denotes the surface potential. These equations apply independent of any surface potentials. The barrier height for the setting-in of strong inversion is obtained, if $\Psi_S$ in equations (2a) and (2b) is according to equations (1a) and (1b) set to be equal to the surface potential $\Psi_S(inv)$.

The difference $E_F-E_V$ between the Fermi level and the energy level of the valence band, or the valence band edge, respectively, in a p-doped semiconductor material, and a difference $E_C-E_F$ between the energy level of the conduction band and the Fermi level in an n-doped semiconductor material is in each case dependent on the acceptor concentration $N_A$ and the donator concentration $N_D$, respectively. It applies for these differences:

$$E_F - E_V = kT\ln\left(\frac{N_C}{N_D}\right) \quad (3a)$$

$$E_C - E_F = kT\ln\left(\frac{N_V}{N_A}\right) \quad (3b)$$

(see Sze, l.c., page 39). Here, $N_C$ denotes the effective (equivalent) state density in the conduction band, and $N_V$ denotes the effective (equivalent) state density in the valence band. These state densities are material constants and are, independent of the type of the semiconductor material. For example, for silicon: $N_V=2.66 \cdot 10^{19}$ cm$^{-3}$ and $N_C=2.86 \cdot 10^{19}$ cm$^{-3}$ (see Sze, l.c., page 538).

By high frequency measurements of the junction capacity of a system having an amorphous semi-insulating layer and a crystalline semiconductor layer it can be shown that the amorphous-crystalline heterojunction between the amorphous semi-insulating layer and the adjoining semiconductor material acts like a Schottky junction. For the barrier height of such Schottky junction to a p-doped semiconductor material:

$$q\Phi_{Bp}=E_g-q(\Phi_m-\chi) \quad (4a)$$

Equivalently, for the barrier height of such Schottky junction to an n-doped semiconductor material:

$$q\Phi_{Bn}=q(\Phi_m-\chi) \quad (4b)$$

(see Sze., l.c., page 226). In this connection $E_g$ denotes the band gap of the used semiconductor material, $\chi$ the electron affinity, and $q\Phi_m$ the work function of the used Schottky metal. The band gap $E_g$ and the electron affinity $\chi$ are material constants. For example, for silicon as a semiconductor material: $E_g=1.12$ eV and $q\chi=4.05$ eV, for gallium arsenide (GaAs): $E_g=1.42$ eV and $q\chi=4.07$ eV, and for silicon carbide (SiC) of the 6H polytype: $E_g=3.05$ eV and $q\chi=3.77$ eV.

Applying equations (4a) and (4b) to an amorphous heterojunction at which an amorphous material having a work function $q\Phi_a$ contacts the channel zone 33 instead of a Schottky metal, the barrier height is in an equivalent manner:

$$q\Phi_{Bp}=E_g-q(\Phi_a-\chi) \quad (5a)$$

$$q\Phi_{Bn}=q(\Phi_a-\chi) \quad (5b).$$

Using equations (2a) and (2b), which in connection with equations (1a) and (1b) define the required barrier height for setting-in of the inversion, and using equations (5a) and (5b) for that work function $q\Phi_a$ of the amorphous semi-insulating channel control layer that is required that an inversion layer develops it is obtained as a condition:

$$q\Phi_a \leq E_g+q\chi-q\psi_s(inv)-(E_F-E_V) \quad (6a)$$

$$q\Phi_a \geq q\chi-q\psi_s(inv)+(E_C-E_F) \quad (6b).$$

Equation (6a) is valid for a p-doped drift zone, i.e. defines the required work function of the amorphous material of the channel control layer 32 for development of an n-channel in a p-doped drift zone, and equation (6b) is valid for an n-doped channel zone 31, i.e. it defines the required work function of the amorphous material of the channel control layer 32 for the development of a p-channel in an n-doped channel zone.

The surface potentials and the energy differences given in equations (6a) and (6b) are referring to equations (1a) and (1b) as well as (3a) and (3b) temperature-dependent. The work function $q\Phi_a$ is selected such that the conditions according to equations (6a), (6b), (7a) or (7b) are at least valid in the temperature range for which the component is specified. This temperature range is, e.g., between 225K and 425K.

As an example p-doped silicon having an acceptor concentration $N_a$ of $1\cdot10^{17}$ cm$^{-3}$ is examined as the material of the channel zone. The following values are each valid for room temperature (about 300K). According to equation (1a) the contact potential required for an inversion is in this case: $\psi_s(inv)$=0.82V. The difference between the conduction band and the valence band is in this case $E_F-E_V$=0.12 eV, so that according to equation (2a) a barrier height of 0.94 eV results that is at least to be achieved. For higher doping concentration $N_A$ of about $10^{18}$ cm$^{-3}$ a higher contact potential $\Psi_S$=0.93V is required for the onset of strong inversion. However, the difference $E_F-E_V$ reduces to about 0.07 eV, so that an overall barrier height of about 1.0 eV results.

The barrier height that according to equation (5a) is to be set by the work function has to be at least 0.94 eV for the first example and at least 1.0 eV for the second example, so that due to the mere presence of the channel control layer 21 an inversion channel develops in the channel zone 31.

With GaAs (having a band gap of $E_g$=1.42 eV, an electron affinity of 4.07 eV, an intrinsic concentration of $1.8\cdot10^6$ cm$^{-3}$, and an equivalent state charge $N_V$ at the valence band edge of $7\cdot10^{18}$ cm$^{-3}$) as the material of the drift zone a barrier height of $q\Phi_{Bp}$=1.28 eV is obtained for the onset of the strong inversion at an acceptor concentration $N_A$=$1\cdot10^{15}$ cm$^{-3}$ of the channel zone 31. According to equation (6a), the required work function is 4.21 eV or less.

With SiC of polytype 6H (having a band gap of 3.05 eV, an electron affinity of 3.77 eV, an intrinsic concentration of $1.6\cdot10^{-6}$ cm$^{-3}$, and an equivalent state density $N_V$ at the valence band edge of $2.5\cdot10^{19}$ cm$^{-3}$) as the material of the channel zone 31 a barrier height of $q\Phi_{Bp}$=2.75 eV is obtained for the onset of the strong inversion at an acceptor concentration of $N_A$=$1\cdot10^{15}$ cm$^{-3}$ of the channel zone. According to equation (6a), the required work function is 4.07 eV or less.

A layer suitable as the amorphous semi-insulating channel control layer 21 is, e.g., an amorphous DLC layer deposited by HF deposition at a frequency of about 13.56 MHz in a capacitively coupled "parallel plate reactor". Methane or another gaseous hydrocarbon is used as a first precursor gas for the carbon of the DLC layer. By adding silane as a second precursor gas a silicon doping of the DLC layer is obtained. The characteristics of the DLC layer, in one embodiment its work function, are determined by the HF power, the work pressure in the process chamber, the gas flows of the precursors, and the chamber geometry. The latter determines the self-bias developing in the plasma and being responsible for acceleration of the positively charged ion cores to the semiconductor layer, on which the amorphous layer is to be deposited.

A DLC layer having a work function of about 4.17 eV, i.e. having a barrier height of 1.0 eV on a p-doped layer, may, e.g. be deposited using a work pressure of about 100 mT in the process chamber, a gas flow ratio between the first and the second precursor gas of about 3, and an HF power of about 200 W.

It should be mentioned that using a DLC layer as the amorphous semi-insulating layer is only an example and that any other amorphous semi-insulating layers may be used in which by suitable selection of the deposition conditions the work function is adjusted such that in connection with a control electrode 33 an inversion channel can be controlled in the channel zone 31.

The conditions for the development of an inversion layer in the p-doped drift zone 30 only controlled by the channel control layer 32 will be explained in the following with reference to the band diagrams illustrated in FIGS. 2A and 2B. FIG. 2 illustrates left-hand the band diagram for the amorphous channel control layer "A", and right-hand for the semiconductor material "S". $E_{VAC}$ denotes the energy level of the vacuum, $E_{opt}$ denotes the optical band gap of the amorphous material, and $E_i$ denotes the intrinsic level of the semiconductor. FIG. 2B illustrates the band diagram of the amorphous-crystalline heterojunction.

Due to the different Fermi levels of the amorphous material and the semiconductor material a band bending occurs in the semiconductor material. The amplitude of this band bending corresponds to the contact potential $\Psi_S$, where a strong inversion sets in when—as illustrated—the band bending at the semiconductor surface assumes twice the value of the difference between the Fermi level $E_F$ and the intrinsic level $E_i$. The barrier height $q\Phi_{Bp}$ corresponds to the contact potential or the band bending plus the difference $E_F-E_V$ between the Fermi level and the energy level at the valence band edge, respectively.

The band diagram explained before is valid for any semiconductor material, i.e. also for gallium arsenide (GaAs) having a band gap $E_g$=1.42 eV and an electron affinity $q\chi$=4.07 eV, or silicon carbide (SiC), in one embodiment 6H—SiC having a band gap $E_g$=3.05 eV and an electron affinity $q\chi$=3.77 eV.

The control electrode 33, that is separated from the channel zone 31 by the channel control layer 32, enables a control of the component. The component may be realized as a normally-on or a normally-off component. In a normally-on component the work function of the material of the amorphous semi-insulating channel control layer 32 and the doping of the channel zone are adapted to one another such that an inversion channel develops between the control electrode 33 and the channel zone 31 already at a control voltage of 0V. This is the case when one of the equations (6a) or (6b) is met. In a component having a p-doped channel zone 31 the control voltage applied between the control electrode 33 and the channel zone required for blocking the component is a negative voltage, and in a component having an n-doped channel zone 31 the control voltage applied between the control electrode 33 and the channel zone 31 requires for blocking the component is a positive voltage.

In a normally-off component the work function $q\Phi_a$ of the material of the channel control layer 32 and the doping concentration of the channel zone 31 are adapted to one another such that an inversion channel does not (yet) develop in the channel zone, i.e. equations (6a) and (6b) are not met.

As an example the embodiment explained above of a p-doped channel zone having an acceptor concentration of $N_A$=$10^{18}$ cm$^{-3}$ is examined. As explained, for developing an inversion channel at a control voltage of zero a work function $q\Phi_a \geq 4.17$ eV is required. Development of an inversion channel at a control voltage of zero is prevented when either the doping of the channel zone 31 is higher than the mentioned $10^{18}$ cm$^{-3}$, or when the work function is set such that it is higher than the mentioned 4.17 eV. Generally, development of an inversion channel at a control voltage of 0V is prevented when in a p-doped channel zone of a given doping concentration the work function $q\Phi_a$ is higher than the value of that work function for which equation (6a) is only just valid. It therefore applies:

$$q\Phi_a > E_g + q\chi - q\psi_s(inv) - (E_F - E_V) \qquad (7a)$$

The doping concentration of the channel zone 31 is taken into account in the surface potential $q\psi_s(inv)$ and the energy difference $E_F - E_V$, respectively.

Amorphous semi-insulating layers have a high state density $N_F$ at the Fermi level, which is in the range of $10^{20}$ cm$^{-3}$eV$^{-3}$ to $10^{22}$ cm$^{-3}$eV$^{-3}$. The Debye length $L_D$ of amorphous semi-insulating layers is given by:

$$L_D = \sqrt{\frac{\varepsilon}{q^2 N_F}} \qquad (9)$$

q being the elementary charge, $\in$ being the dielectric constant of the amorphous semi-insulating layer, and $N_F$ being the state density. The dielectric constant is, e.g., between about 4 and 6.

The interface capacitance $C_S$ of an amorphous semi-insulating layer arranged on a semiconductor material is given by the ratio of the dielectric constant $\in$ and the Debye length $L_G$, i.e.

$$C_s = \frac{\varepsilon}{L_D}. \qquad (10)$$

Using this interface capacitance $C_S$ an interface state charge density may be calculated, which is:

$$D_s = \frac{C_s}{q^2}. \qquad (11)$$

For the above given range of state densities $N_F$ at the Fermi level and a dielectric constant $\in=6$ the interface state charge density considering equations (9) to (11) is up to $10^{14}$ cm$^{-2}$ eV$^{-1}$.

This high interface state density $E_S$ on the one hand has the effect that a shift of the Fermi level by applying a control voltage is only possible to a small extent. On the other hand due to the high state density already low shifts of the Fermi level, or band bendings, respectively, in the range of several 10 mV or several 100 mV are sufficient to effect such strong change of the state density at the interface between the channel control layer 32 and the channel zone 31, as it is required for pinching off or developing, respectively, an inversion channel. Such a slight shift of the Fermi level can be obtained by applying an outer voltage, i.e. by applying a control voltage to the control electrode 33. However, the control voltage to be applied is higher than the required shift of the Fermi level; this will be explained in the following with reference to the electrical circuit diagram illustrated in FIG. 3 of the amorphous semi-insulating channel control layer 31 and the interface between the amorphous semi-insulating channel control layer 31 and the channel zone.

This circuit diagram includes two components: The circuit diagram of the amorphous semi-insulating channel control layer 31, that includes a parallel circuit of an ohmic resistor $R_a$ and a capacitance $C_A$; and the circuit diagram of the interface of the amorphous semi-insulating channel control layer 32 to the channel zone, that includes a parallel circuit of an ohmic resistor $R_S$ and the interface capacitance $C_S$. Capacitance $C_a$ is the dielectric capacitance of the amorphous semi-insulating layer 31 that is given by the ratio of the dielectric constant $\in$ of the amorphous semi-insulating layer 32 and its layer thickness. In this connection it should be mentioned that the capacitances and the resistances in the circuit diagram represent specific capacitances and resistances per unit area.

$R_a$ represents the voltage-dependent resistance of the amorphous semi-insulating channel control layer 31 according to the Poole-Frenkel law, and $R_S$ represents the resistance present at the interface.

Referring to the circuit diagram, a control voltage VG applied between the amorphous semi-insulating channel control layer 32 and the channel zone includes two components: a first component $V_a$ that drops across the amorphous layer 32; and a component $V_S$ that drops across the interface. The component that drops across the interface represents the shift of the Fermi level $E_F$ of the amorphous semi-insulating layer 32 required for development or interruption of an inversion channel. This shift of the Fermi level, i.e. the band bending, respectively, in the amorphous layer is very low compared to the band bending in the channel zone 31 of the semiconductor, and is therefore not illustrated in the band diagram according to FIG. 2.

Resistance $R_a$ is dependent on the voltage applied to the amorphous semi-insulating channel control layer 32 or on the field-strength present in the amorphous semi-insulating channel control layer 32, respectively. The current (control current) through the amorphous semi-insulating channel control layer 32 into the channel zone 31 increases disproportionally high with increasing voltage or field-strength, respectively.

In order to develop or interrupt a channel by applying a control voltage on the one hand, and in order to prevent a strong increase of the control current with increasing control voltage due to the Poole-Frenkel-effect on the other hand, the work function for a given doping concentration of the channel zone 31 is in one embodiment:

$$1.1 \cdot (E_g + q\chi - q\psi_s(inv) - (E_F - E_V)) > q\Phi_a > E_g + q\chi - q\psi_s(inv) - (E_F - E_V) \qquad (8a)$$

Accordingly, development of an inversion channel at a control voltage of 0V is prevented when in an n-doped channel zone of a given doping concentration the work function $q\Phi_a$ is lower than that value of the work function for which equation (6b) is only just met, it therefore applies:

$$q\Phi_a < q\chi - q\psi_s(inv) + (E_C - E_F) \qquad (7b).$$

In accordance with equation (8a) it applies in one embodiment:

$$0.9 \cdot (q\chi - q\psi_s(inv) + (E_C - E_F)) < q\Phi_a < q\chi - q\psi_s(inv) + (E_C - E_F) \qquad (8b)$$

The conditions for development of an inversion layer in a p-doped drift zone 30 controlled by the channel control region will now be explained with reference to a band diagram illustrated in FIGS. 2A and 2B. FIG. 2A illustrates left-hand the band diagram for the amorphous channel control layer "A", and right-hand for the semiconductor material "S". Here, $E_{VAC}$ denotes the energy level of the vacuum, $E_{opt}$ denotes the optical band gap of the amorphous material, and $E_i$ denotes the intrinsic level of the semiconductor. FIG. 2B illustrates the band diagram of the amorphous-crystalline heterojunction.

Due to the different Fermi levels of the amorphous material and the semiconductor material there is a band bending in the semiconductor material. The height of this band bending corresponds to the contact potential $\Psi_S$, where a strong inversion sets in when—as illustrated—the band bending at the semiconductor surface is twice the difference between the Fermi level $E_F$ and the intrinsic level $E_i$. The barrier height $q\Phi_{Bp}$ corresponds to the contact potential or to the band bending plus the difference $E_F-E_V$ between the Fermi level and the energy level of the valence band edge, respectively.

Referring to the band diagram illustrated in FIG. 2, applying a control voltage effects a shift of the Fermi level of the amorphous semi-insulating channel control layer, and therefore influences the band bending in the semiconductor material. For interruption of the inversion channel, and therefore for blocking the component, a negative control voltage is to be applied with a p-doped channel zone 21. This negative control voltage effects a lowering of the Fermi level of the amorphous layer; through this the band bending is reduced, so that the inversion channel is interrupted.

The band diagram illustrated before is valid for any semiconductor material, such as gallium arsenide (GaAs) having a band gap $E_g=1.42$ eV and an electron affinity $q\chi=4.07$ eV, or silicon carbide (SiC), in one embodiment 6H—SiC having a band gap $E_g=3.05$ eV and an electron affinity $q\chi=3.77$ eV.

In a normally-off component the work function of the material of the channel control layer 32 and the doping concentration of the channel zone 31 are—as explained—adapted to one another such that at a control voltage of 0V no inversion channel just develops. Beginning with a "normally-on" amorphous-crystalline heterojunction having a doping concentration N of the channel zone and a work function $q\Phi_a$ and in which an inversion channel develops at a control voltage of 0V, a "normally-off" amorphous-crystalline heterojunction can be obtained by increasing the doping concentration of the channel zone at a constant work function 31, or by changing the work function at a constant doping of the channel zone 31.

With a p-doping of the channel zone 31 the work function is to be increased compared to a normally-on amorphous-crystalline heterojunction, and with an n-doping of the channel zone 31 the work function is to be decreased compared to a normally-on amorphous-crystalline heterojunction. It goes without saying that also both parameters may be varied.

If one considers the band diagram illustrated in FIG. 3, then with a normally-off junction the band bending in the semiconductor material of the channel zone 31 effected by the amorphous semi-insulating channel control layer 31 is not sufficient for developing an inversion channel. A sufficient band bending is only achieved by applying a control voltage, where a positive control voltage is to be applied for a p-doped channel zone 31, and a negative control voltage is to be applied for an n-doped channel zone. With a p-doped channel zone 31 applying the control voltage effects an increase in the Fermi level $E_F$ of the material of the amorphous semi-insulating channel control layer 32, so that a band bending sufficient for development of an inversion channel results. Accordingly, with an n-doped channel zone 31 applying the control voltage effects a decrease of the Fermi level $E_F$ of the material of the amorphous semi-insulating channel control layer 32.

The control structure 30 having an amorphous semi-insulating channel control layer 32 and having been explained before with reference to FIG. 1 may be used in any commonly known transistor component, such as a MOSFET or an IGBT, where only the MOS structure that is present in known components and having a gate electrode, a gate dielectric layer, and a body zone is to be replaced by the explained control structure 30 with the channel control layer 32 and the control electrode 33.

FIG. 4 by a cross-section through a semiconductor body 100 illustrates an embodiment of a power transistor component. This transistor component is constructed like a usual power MOSFET or power IGBT with the difference that instead of a usual MOS control structure, having a gate electrode, a gate dielectric, and a body zone, a control structure 30 having a control electrode 33, an amorphous semi-insulating channel control layer 32, and a channel zone 31 is provided. In connection with this control structure all explanations that have been made in connection with FIGS. 1 and 2 apply accordingly. Following the term MOSFET the present component is a MASSFET (Metal Amorphous Semiinsulator Semiconductor Fieldeffect Transistor).

Due to the similarity of the structure of the illustrated MASSFET with a MOSFET, component zones that correspond to the ones in a MOSFET will be referred to in the same manner in the following. Therefore, the first connection zone 11 will be referred to as source zone 11 in the following, the second connection zone 21 will be referred to as drain zone in the following, and the control electrode 33 will be referred to as gate electrode in the following. Source zone 11 is contacted by a source electrode 41 forming a source terminal S of the component, drain zone 21 is contacted by a drain electrode 42 forming a drain terminal D of the component, and the gate electrode 33 forms a gate terminal G of the component.

In the power component illustrated in FIG. 4 source zone 11 and channel zone 31 directly adjoin one another, while between the channel zone 31 and the drain zone 21 a drift zone 22 is arranged, in which a space charge zone can propagate when the component blocks, and which due to this substantially takes over a blocking voltage applied to the component.

The component may be realized as an n-conducting or as a p-conducting component. The conduction type of the component is determined by the doping type of the source zone 11. In an n-conducting component source zone 11 is n-doped, and in a p-conducting component source zone 11 is p-doped. Channel zone 31 is doped complementarily to source zone 11. Drain zone 21 is of the same doping type as source zone 11, however, it may also be doped complementarily to source zone 11, where in the latter case the component works like an IGBT. Drift zone 22 is of the same conduction type as source zone 11 but is lower doped. The doping concentration of the source zone 11 and the drain zone 21 are, e.g., in the range from $10^{19}$ to $10^{21}$ cm$^{-3}$, and the doping concentration of the drift zone 22 is, e.g., in the range of between $10^{13}$ cm$^{-3}$, and $10^{15}$ cm$^{-3}$. The doping concentration of the channel zone 31 is—as explained—adapted to the work function $q\Phi_a$ of the material of the channel control layer 32 such that an inversion channel can be controlled in the channel zone 31 along the channel control layer 32 between the source zone 11 and the drift zone 22.

The component may be realized as a normally-on component. In this case the work function $q\Phi_a$ of the material of the channel control layer 32 and the doping concentration of the channel zone 31 are adapted to one another such that equations (6a) and (6b) are met. This inversion channel can be interrupted by applying a control voltage between the gate electrode 33 and the channel zone 31, where in an n-conducting component a negative voltage and in a p-conducting component a positive voltage is to be applied for interrupting the channel.

The component may also be realized as a normally-off component. In this case the doping concentration of the channel zone 31 and the work function of the material of the channel control layer 32 are adapted to one another such that at a control voltage of 0V an inversion channel in the channel zone 31 does not just develop. For development of such inversion channel a positive control voltage is to be applied in an n-conducting component, and in a p-conducting component a negative control voltage is to be applied. A component is normally off when—as explained—one of the conditions (7a, 8b) or (7B, 8B) is met.

In the component illustrated channel zone 31 is electrically connected to the source electrode 31, so that the control voltage can be applied between the gate electrode 33 and the source electrode 41. For connecting the channel zone 31 to the source electrode 41 a connection zone 12 is provided that is of the same conduction type as channel zone 31 and that contacts source electrode 41. Connection zone 12 could extend to the channel zone 31. In the embodiment illustrated a lower doped component zone 23 of the same conduction type as the channel zone and the connection zone 12 is provided between the connection zone 12, the connection zone having a doping concentration which is, e.g., in the range of the doping concentration of the source zone 11 or the drain zone 21. This lower doped component zone 23 extends to the drift zone 22 and optionally extends (as illustrated) along the drift zone 22 to the drain zone 21.

The operating principle of the component illustrated will shortly be explained in the following. The component conducts when by suitably driving the gate electrode 33 an inversion channel is present in the channel 31 between the drift zone 22 and the source zone 11. In this case upon applying a voltage between the drain terminal D and the source terminal S a current can flow between drain zone 21 and source zone 11, namely via drift zone 22 and the inversion channel in the channel zone 21. The component blocks when by suitably driving the gate electrode 23 the inversion channel in the channel zone 31 is interrupted, and when in an n-conducting component a positive voltage is applied between drain D and source S, or when in a p-conducting component a negative voltage is applied between Drain D and source S, respectively. Starting from a pn-junction between the channel zone 31 and the lower doped region 23 adjoining the channel zone 31, on the one hand, and the drift zone 22, on the other hand, in the blocking state a space charge zone that takes over the blocking voltage propagates in the drift zone 22.

In the component illustrated, in which the lower doped region 23 optionally extends along the drift zone 22 to the drain zone 21, the space charge region also propagates in a direction perpendicular to the current flow direction in the drift zone 22 as well as in the region 23. Through this doping charges present in the drift zone 22 and in the lower doped region 23 compensate each other, so that a higher voltage blocking capability of the component can be obtained compared to components in which no region doped complementarily to the drift zone 22 extends along the drift zone 22.

As illustrated, the channel control layer 32 may be connected to the source electrode 41. In the current flow direction the channel control layer 31 extends from the source zone 11 to the drift zone 22, where the channel control layer 32 may overlap the source zone 11 and the drift zone 22. A passivation layer 51, such as an oxide layer, overlapping the drift zone 22 may be arranged between the channel control layer 32 and the drain zone 21. Channel control layer 32 optionally extends along the drift zone 22 to the drain zone 21 and may be connected to the drain electrode 42. The reference character 32 given in brackets in FIG. 4 relates to this last-mentioned alternative.

In the embodiment, in which the channel control layer 32 extends along the drift zone 22 to the drain zone 21, a further doped channel zone 24 doped complementarily to the drift zone 22 may be arranged in the drift zone 22 along the channel control layer 32, this further channel zone 34 extending in the current flow direction from the drain 21 to the channel zone 31 of the control structure. The work function of the channel control layer 32 and of this further channel zone are in one embodiment adapted to one another such that an inversion channel develops in this further channel zone 24. This is the case when equations (6a) or (6b) are met. In an n-conducting component the further channel zone 24 is p-doped, in a p-conducting component it is n-doped. The doping concentration of this further channel zone 24 may correspond to the doping concentration of the channel zone 31 when the component is a normally-on component. In a normally-off component the doping concentration of the further channel zone 34 is lower than the doping concentration of the channel zone 31 of the control structure 30.

The functionality of the component illustrated in FIG. 4 has been verified using a test structure for which different electrical characteristics were determined that will be explained with reference to FIGS. 5 to 7 in the following. The test component is an n-conducting component having a length of the channel zone 31 in current flow direction of 10 µm and a length of the drift zone 22 in current flow direction of 80 µm. The channel zone 31 was formed by ion implantation using a dose of $1 \cdot 10^{12}$ cm$^{-3}$ of p-dopants, namely boron atoms in the example. For forming the drift zone 22 n-dopants were implanted using an implantation dose of $8 \cdot 10^{11}$ cm$^{-3}$. Arsenic was used as the dopant. Due to segregation effects when driving in the n-dopants about 63% of the implanted dopants remain in the semiconductor, so that an electrically active dose of $5 \cdot 10^{11}$ cm$^{-2}$ results in the drift zone 22.

The channel control layer 32 of the test component is a DLC layer having a work function of $q\Phi_a = 4.17$ eV and a thickness of 350 nm and can be produced using one of the methods explained before. In the test component the channel control layer 32 extends along the drift zone 22 to the drain zone 21. The work function $q\Phi_a$ and the doping concentration of the channel zone 31 in this component are adapted to one another such that the component is a normally-off component.

The doping of the region 23, which in the embodiment corresponds to a substrate doping, was about $2.6 \cdot 10^{14}$ cm$^{-3}$, this corresponds to a specific resistance of about 50 Ωcm.

As a reference structure for comparing the electrical characteristics of the test component a transistor structure is used that is constructed in accordance with the test component and that is different from the test component only in that instead of the control structure 30 with the amorphous semi-insulating channel control layer 32 a MOS control structure with a gate oxide layer having a thickness of 50 nm is provided. The test component as well as the reference component are silicon components.

Figure 5:
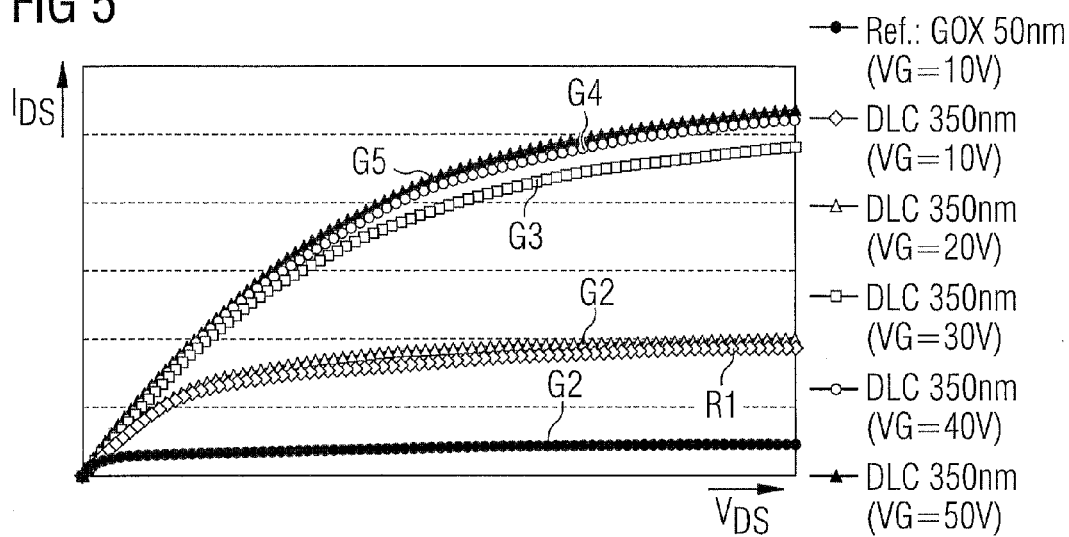
FIGS. 5 to 7 illustrate by characteristic curves the operating principle of a component according to FIG. 4.

FIG. 5 illustrates a drain current $I_S$ dependent on a drain-source-voltage $V_S$ for the reference component at a control voltage VG of 10V (curve R1) as well as for the test component at control voltages of 10V (curve G1), 20V (curve G2), 30V (curve G3), 40V (curve G4) and 50V (curve G5). A comparison of these curves illustrates that the test component at a control voltage of 20V behaves like the reference component at a control voltage of 10V. The higher control voltage required for the test component having the amorphous semi-insulating channel control layer substantially results from the voltage drop across the amorphous layer explained before, this voltage drop being determined by the Poole-Frenkel-conduction and the higher layer thickness of this amorphous layer—compared to the oxide layer of the reference component. With values between 6 and 7 for the amorphous layer of the test component and with about $\in = 4$ for the oxide layer of the reference component the dielectric constants $\in$ are in the same range. That in the embodiment at a layer thickness of the amorphous layer 32 that is a factor 7 higher compared to the layer thickness of the oxide layer of the test component a control voltage is required that is only a factor 2 higher illustrates, that the amorphous layer does not behave like a dielectric, but that the factors that determine the amplitude of the control voltage is the Poole-Frenkel-conduction mechanism, the work function and the high interface state density of the amorphous layer 32.

Figure 6:
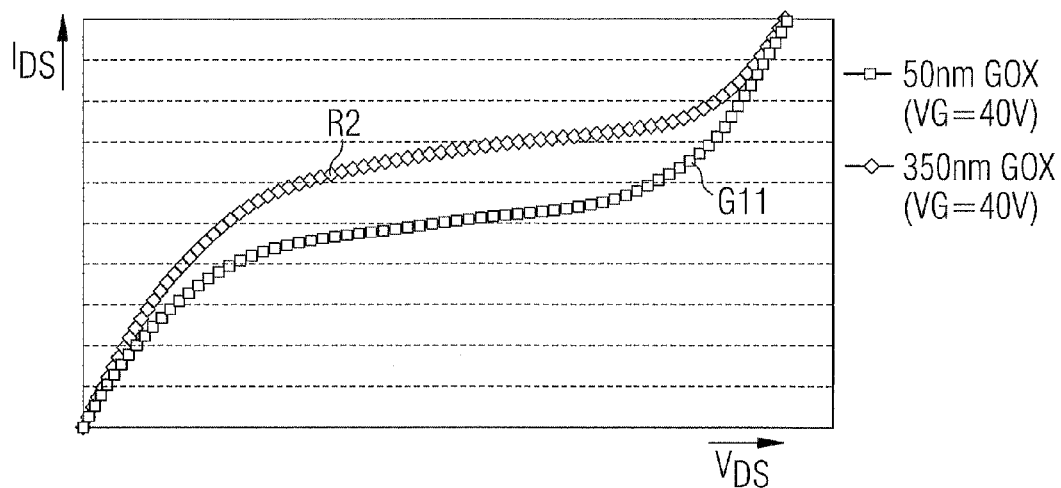

FIG. 6 illustrates the drain current $I_{DS}$ dependent on the drain source voltage $V_{DS}$ at drain-source voltages from zero to the onset of an avalanche breakthrough. In the present case the gate control voltages were equal (40V) in each case. R2 illustrates the characteristic curve of the reference component, G11 illustrates the characteristic curve of the test component. As can be seen by comparing these characteristic curves, the avalanche breakthrough in both components sets in at approximately equal drain-source voltages.

Figure 7:
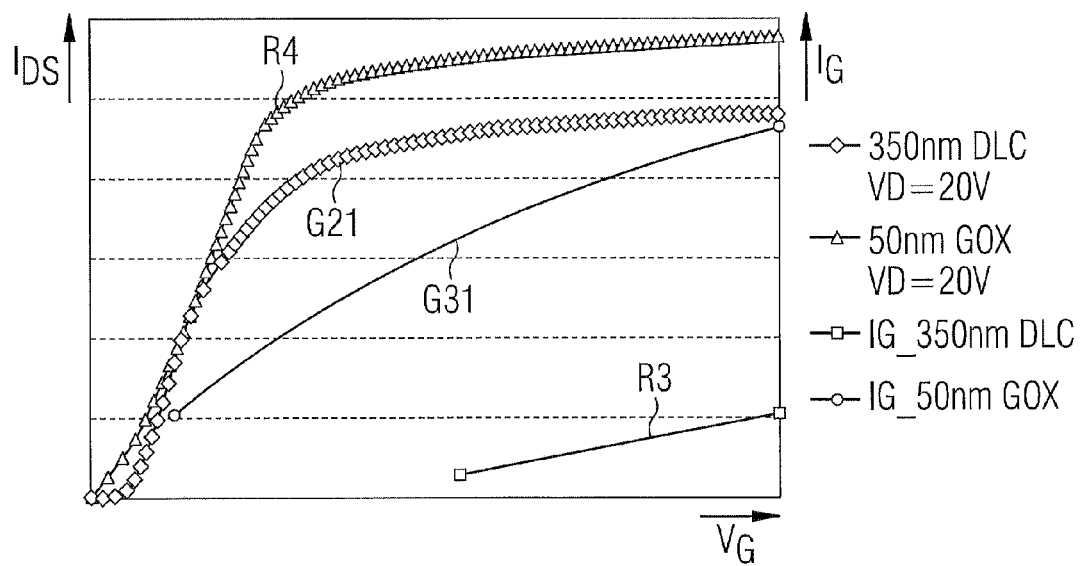

FIG. 7 illustrates the drain-source current $I_{DS}$ dependent on the control voltage VG for the test component (curve G21), and the reference component (curve R4) at respectively equal drain-source voltages (20V). In FIG. 7, further the gate current for the reference component (curve R3) and the test component (curve G31) are illustrated.

With the help of curves G21 and R4 it can be seen that in both components a saturation sets in at approximately equal control voltages (about 30V). The two components show a different behaviour concerning the gate current. While in the reference component the gate current sets in at voltages of about 50V due to the Fowler-Nordheim-channel-effect, the gate current of the test component already sets in at lower voltages (about 15V).

The earlier increase of the gate current compared to the reference component results from the Poole-Frenkel-emission in the amorphous semi-insulating channel control layer 32. However, also the higher gate current of the test component is in an acceptable range. At a gate voltage of 30V, at which the drain current already assumes a saturation value of about 40 mA, the gate current is only 5 nA. Thus, the gate current is about a factor $10^{-7}$ smaller than the drain current.

The component illustrated in FIG. 4 is a lateral component. In this component source zone 11 and the drain zone 21 are arranged distant to one another in a lateral direction of the semiconductor component. A current flow direction of this component therefore runs in a lateral direction of the semiconductor component. It goes without saying that the concept explained before, according to which in the transistor component a MOS structure is replaced by a control structure 30 having an amorphous semi-insulating channel control layer 32, is not restricted to be used in lateral components, but may also be used in vertical components. Vertical components are components in which a current flow direction runs in a vertical direction of the semiconductor body.

Figure 8:
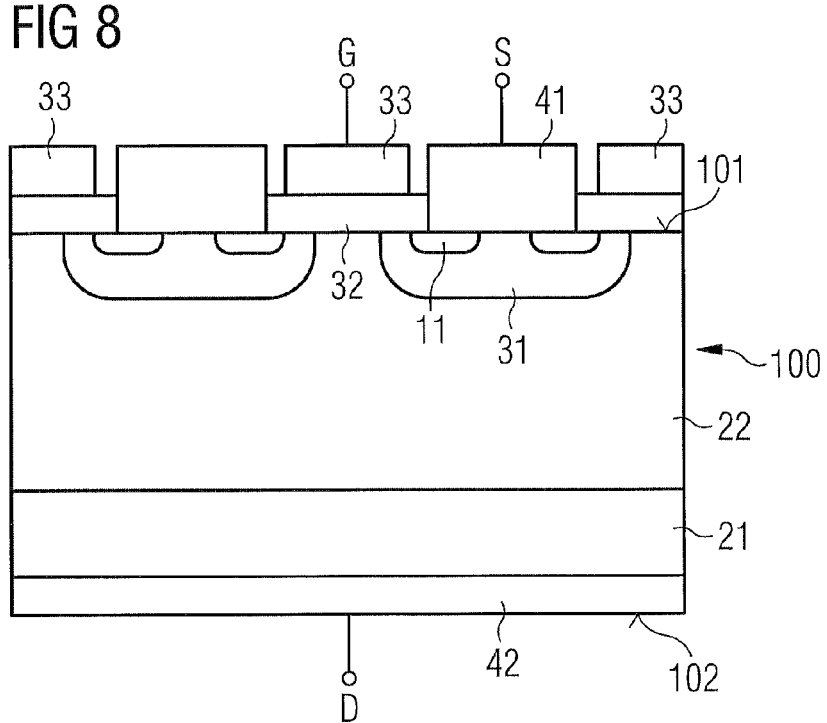
FIG. 8 illustrates a first embodiment of a vertical power transistor component.

FIG. 8 by a cross-section through a semiconductor body 100 illustrates a first example of a vertical transistor component. This component is constructed cell-like and includes a plurality of similar structures each having a source zone 11, a channel zone 31, a drift zone 22 as well as a drain zone 21. In this component the drain zone 21 and the drift zone 22 are common to all transistor cells. The control structure 30 of this component is a planar control structure. In this component the channel control layer 33 is arranged above a first side 101, which will also be referred to as front side, of the semiconductor body 100, and extends in the lateral direction from the source zone 11 via the channel zone 31 to a section of the drift zone 22 extending to the front side 101. The source zones 11 are each contacted by source electrodes 41 that each contact the source zones 11 and the channel zones 31 and short-circuit these zones respectively. In this component the drain zone 31 is arranged in the region of a second side 102, that will also be referred to as rear side in the following, of the semiconductor body 100 and is contacted in the region of this rear side 102 by a drain electrode 42. The individual transistor cells are connected in parallel due to the fact that the individual source electrodes 41 are electrically connected with one another.

Figure 9:
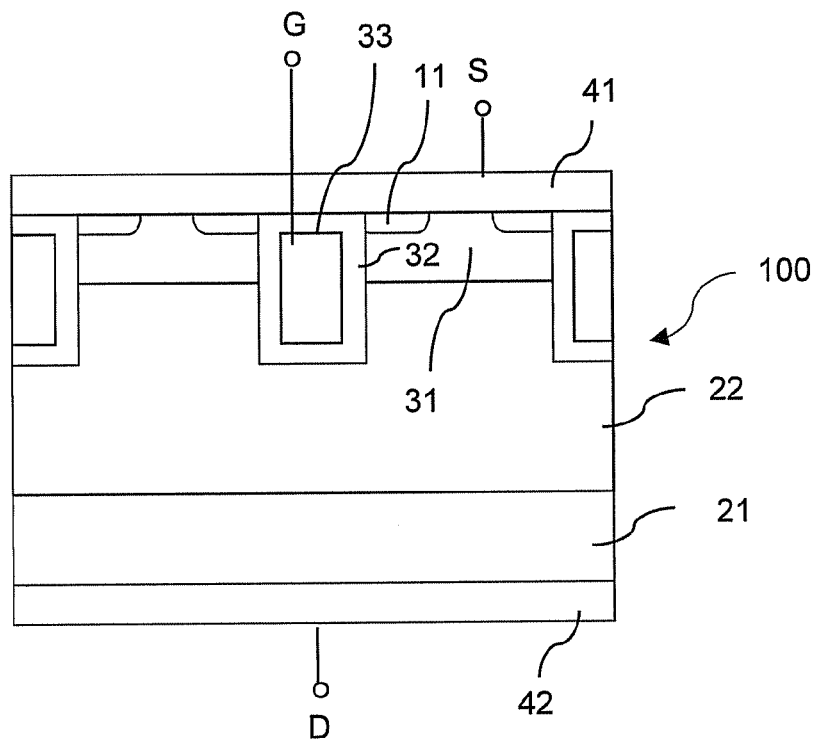
FIG. 9 illustrates a second embodiment of a vertical power transistor component.

FIG. 9 illustrates a component that is modified compared to the component according to FIG. 8. The component according to FIG. 9 is implemented as a trench transistor. Here, the control electrode 33 is arranged in a trench of the semiconductor body 100 and extends in a vertical direction of the semiconductor body from the source zone 11 along the channel zone 31 into the drift zone 22. Here, the control electrode 33 is separated from the source zone 11, the channel zone 31, and the drift zone 22 by the amorphous semi-insulting channel control layer 32. The component illustrated in FIG. 9 is also constructed cell-like and includes a plurality of similar cells each having a source zone 11, a channel zone 31, a drift zone 22, and a drain zone 21, where the drain zone 21 and the drift zone 22 are common to all transistor cells.

The individual transistor cells of the components illustrated in FIGS. 7 and 8 may have any conventional cell geometry.

Figure 10:
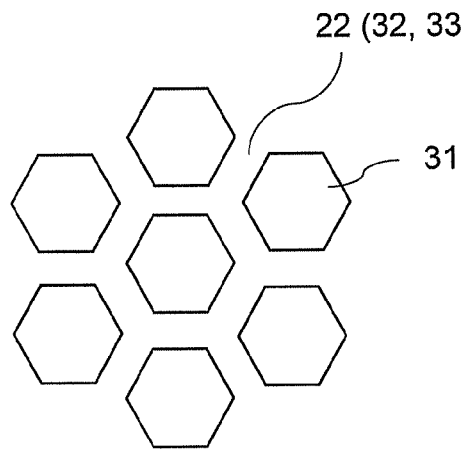
FIG. 10 schematically illustrates a vertical transistor component having hexagonal transistor cells.

As it is schematically illustrated in FIG. 10, the individual transistor cells may, e.g., have a hexagonal cell geometry. In this case the channel zone 31—seen in a horizontal section plane through the semiconductor body—have a hexagonal geometry, where between the individual body zones 31 sections of the drift zone 22 are arranged in the component according to FIG. 8, the control electrode 33 with the amorphous semi-insulating channel control layer 32 is arranged in the component according to FIG. 9. The reference characters given in brackets in FIG. 9 relate to the component according to FIG. 9.

Figure 11:
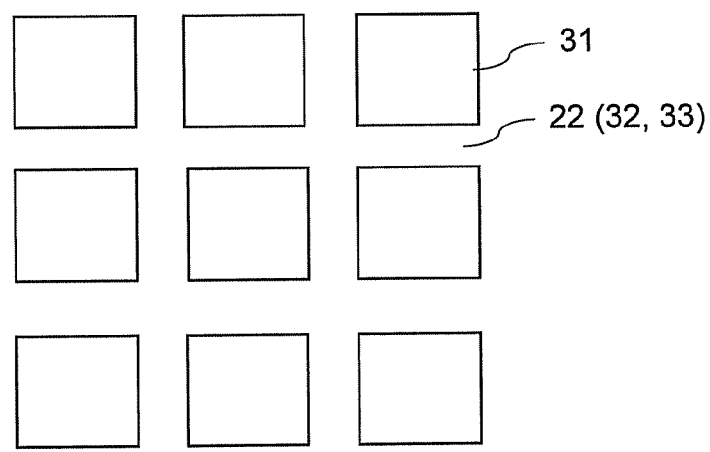
FIG. 11 schematically illustrates a vertical transistor component having rectangular transistor cells.
Figure 12:
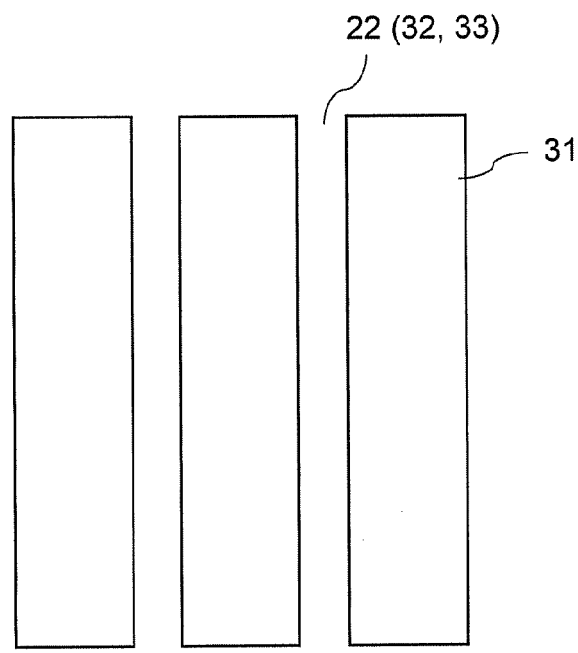
FIG. 12 schematically illustrates a vertical transistor component having stripe-shaped transistor cells.

Referring to FIGS. 10 and 11, the individual transistor cells may in one embodiment have a rectangular, in one embodiment square, geometry (see FIG. 11) or a stripe-shaped geometry (see FIG. 12). In this connection the body zones of the individual transistors cells have a rectangular, in one embodiment square, or a stripe-shaped form, respectively.

Further, the explained concept of replacing a MOS control structure by a control structure with an amorphous semi-insulating channel control layer 31 is, of course, not limited to power components (having a drift zone), but may also be applied to any field-effect transistor.

Figure 13:
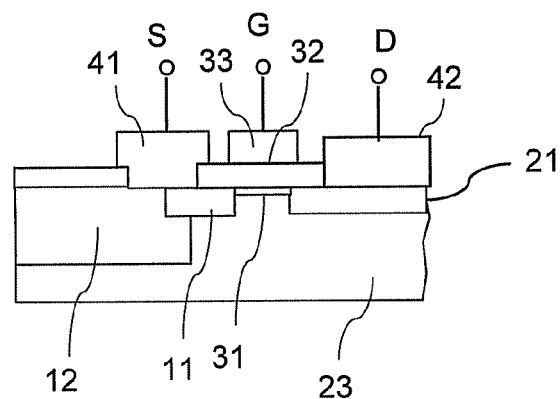
FIG. 13 illustrates a further embodiment of a lateral transistor component.

FIG. 13 illustrates an embodiment of a MASSFET that is not implemented as a power component. This MASSFET is, e.g., different from the one illustrated in FIG. 4 in that no drift zone 22 is provided. Short-circuiting source zone 11 and channel zone 31 by the control electrode 41 using the connection zone 12 is optional in this component. In a manner not illustrated in detail only source zone 11 may be connected to the source electrode 41 in such component. In this case a further terminal is to be provided via which the channel zone 31 can be contacted for applying the control voltage.

Use of an amorphous semi-insulating layer instead of a dielectric layer has the advantage that in an amorphous semi-insulating layer—other than in a dielectric layer of a MOS structure—an injection of hot charge carriers (hot carrier injection) cannot occur even when applying high voltages to the gate electrode. Other than in components having a MOS structure, a drift of the threshold voltage of the component cannot occur in components having an amorphous semi-insulating channel control layer 32. The threshold voltage is the voltage that is to be applied to the gate electrode 33 in order to have—dependent on the type of the component—an inversion channel developed or to have the inversion channel pinched off, respectively.

Further, amorphous semi-insulating layers of a semiconductor material can also be produced on silicon carbide (SiC), as the material for the semiconductor component, with a sufficiently high quality and a sufficiently high long-term stability. So far, producing an oxide with a sufficient quality is a problem when realizing normally-off field-effect transistors on SiC basis.

As an example of a normally-off transistor on SiC basis an n-conducting transistor on the basis of SiC of the 6H polytype is examined in the following. 6H—SiC has an electron affinity $q\chi$ of 3.77 eV, and a band gap $E_g$ of 3.05 eV. The effective state density at the valence band edge is $N_V = 4.8 \cdot 10^{15} \cdot T^{1.5}$ cm$^{-3}$, i.e. at a temperature of T300K: $N_V = 2.5 \cdot 10^{19}$ cm$^{-3}$. For an acceptor concentration of about $1 \cdot 10^{14}$ cm$^{-3}$ of the channel zone 31 the energy difference $E_F - E_V$ between the Fermi level and the valence band is about 0.3 eV according to (3b). Resulting from this a contact potential or surface potential $q\Psi_S$, respectively, is 2.35 eV. Referring to equation (6a) the surface potential required for the onset of strong inversion at a work function $q\Phi_a$ of 4.17 eV would be about 2.37 eV, so that with an acceptor concentration of about $10^{14}$ cm$^{-3}$ the onset of strong inversion already occurs at a control voltage of 0V. In this example a normally-off component would be obtained, if the acceptor concentration would be increased compared to the mentioned $10^{14}$ cm$^{-3}$, i.e. e.g., at an acceptor concentration of about $10^{15}$ cm$^{-3}$ of the channel zone 31. This results directly from equation (7a).

According to a second concept for a control structure the channel zone 31 is arranged in a direction perpendicular to a current flow direction between the amorphous semi-insulating channel control layer 32 and a control electrode or control zone 34, respectively, that is doped complementarily to the channel zone 31.

Figure 14:
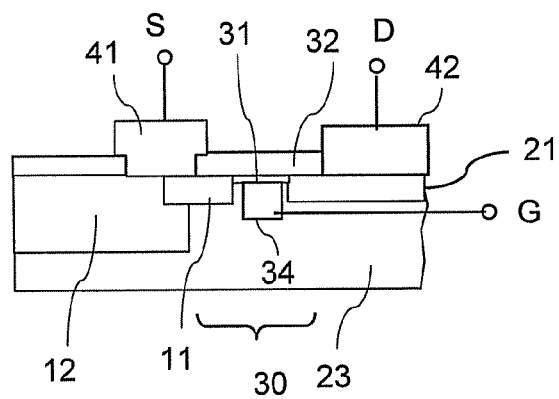
FIG. 14 illustrates by a cross section through a semiconductor body a transistor component having a control structure according to a second embodiment, the control structure including an amorphous semi-insulating channel control layer.

FIG. 14 illustrates a component having such a control structure that is modified compared to the control structure 30 explained before. In this control structure the channel zone 31 is arranged in a direction perpendicular to a current flow direction between the amorphous semi-insulating channel control layer 32 and a control zone 34 that is doped complementarily to the channel zone 31, the control zone 34 will be referred to as a gate zone in the following. The structure of the component illustrated in FIG. 14 is based on the structure of the component illustrated with reference to FIG. 13. However, the control structure 30 with the channel zone 31 between the channel control layer 32 and the gate zone 34 may be used in any of the components explained before and in exchange of the MOS structure in conventional MOS transistors. The operating principle of a component having such control structure will exemplarily be explained for the component according to FIG. 14.

In this component the work function of the amorphous semi-insulating channel control layer 32 and the doping concentration of the channel zone 31 are adapted to one another such that just no inversion channel develops in the channel zone 31 when a control voltage applied between the gate zone 34 and the channel zone 31 is zero. Applying the control voltage between the gate zone 31 and the channel zone 31 can, e.g., be performed by applying a voltage between the gate zone 31 and the source electrode 41, with the source electrode 41—as explained in connection with the component according to FIG. 4—being connected to the channel zone 31 via the connection zone 12, and via the semiconductor region 23 that is lower doped than the connection zone 12. In this component a development of an inversion channel sets in when a control voltage is applied between the gate zone 34 and the channel zone 31 that biases the pn-junction between the gate zone 34 and the channel zone 31 in a blocking direction. Through this in the channel zone 31 an electrical field propagates that punches through into the amorphous semi-insulating channel control layer 32. Due to this punch-through of the electrical field into the amorphous semi-insulating channel control layer 32 the positive charge states, that are already present in the not-energized state due to the explained high state density and the explained band bending, are further amplified so that the development of an inversion channel in the channel zone 31 results.

The work function of the semi-insulating channel control layer 32 and the doping concentration of the channel zone 31 are adapted to one another such that dependent on the conduction type of the component equations (7a), (8a) or (7b), (8B), respectively, are met. The dimensions of the channel zone 31 in a direction perpendicular to the current flow direction are, in one embodiment, selected such that the channel zone 31 when applying a voltage that biases the pn-junction in the blocking direction may completely be depleted. The doping charge of the channel zone 31 when integrated in a direction perpendicular to the current flow direction should lie below the breakthrough charge of the individual semiconductor material. For silicon as a material of the component the breakthrough charge is about $1.4 \cdot 10^{12}$ cm$^{-2}$. When using an amorphous semi-insulating channel control layer 32 having a work function of 4.17 eV the doping concentration is, e.g., $1 \cdot 10^{17}$ cm$^{-3}$ in order to meet the condition mentioned before, namely that an inversion channel does just not develop at a control voltage of 0V. The dimension of the channel zone 31 in the direction perpendicular to the current flow direction are, e.g., in the range of 100 nm, the dopant dose in this direction is then $1 \cdot 10^{12}$ cm$^{-2}$ (=100 nm·$10^{17}$ cm$^{-3}$), which is therefore below the breakthrough charge.

Figure 15:
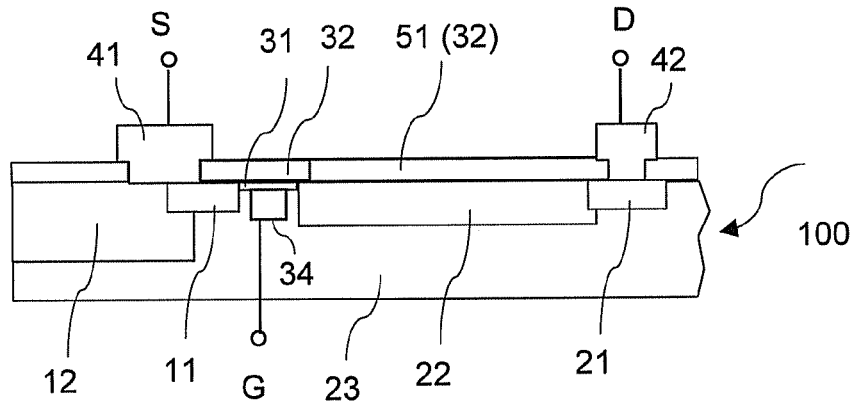
FIG. 15 illustrates a first embodiment of a lateral power transistor component having a control structure according to the second embodiment.

FIG. 15 by a cross-section through a semiconductor body 100 illustrates an alternative of the component according to FIG. 4, in this alternative a control structure 30 according to FIG. 14 is provided. The component according to FIG. 15 is different from the component illustrated in FIG. 4 only in that instead of the gate electrode 33 above the channel control layer 32 a gate zone 34 is provided, the gate zone adjoining the channel zone 31 at that side of the channel zone 31 that is opposed to the channel control layer 32. The explanations that have been made with reference to FIG. 4 do apply to the component according to FIG. 15 accordingly. Thus, the drift zone 22 may, e.g., be covered by a passivation layer 51. Optionally the channel control layer 32 may be realized such that it extends along the drift zone 22 to the drain zone 21.

Figure 16:
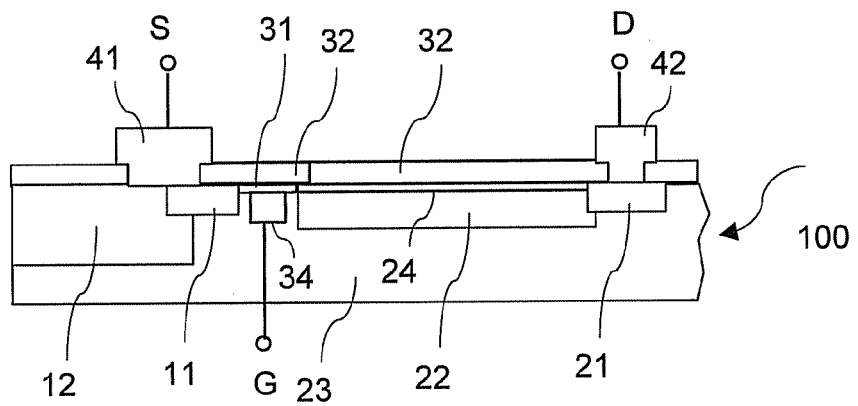
FIG. 16 illustrates a second embodiment of a lateral power transistor component having a control structure according to the second embodiment.

Referring to FIG. 16, in the alternative in which the channel control layer 32 extends to the drift zone 21 there is also the option to provide a further channel zone 24 in the drift zone 22, the further channel zone 24 being doped complementarily to the drift zone 22, and having a doping concentration being adapted to the work function of the amorphous channel control layer 32 such that an inversion channel develops in the further channel layer 24. In an n-conducting component the doping concentration of the further channel zone 24 is, e.g., lower than the doping concentration of the channel zone 31 of the control structure in order to obtain this.

In a further embodiment the doping concentration of the further channel zone 24 equals the doping concentration of the channel zone 31 of the control structure. In this case the channel control layer 32 is connected between the gate electrode 32 and the drain electrode 42. In this case, a potential characteristic that settles in in the channel control layer 32 is at least along major parts of the length of the drift zone 22 sufficient for developing an inversion channel in the further channel zone 24. In the component according to FIGS. 15 and 16 drift zone 22 is embedded in a semiconductor region 23 doped complementarily to the drift zone, this semiconductor region 23 extending along the drift zone 22 from the source zone 11 to the drain zone 21, and this semiconductor region 23 effecting the compensation effect illustrated in connection with a component according to FIG. 4 when the component blocks.

Figure 17:
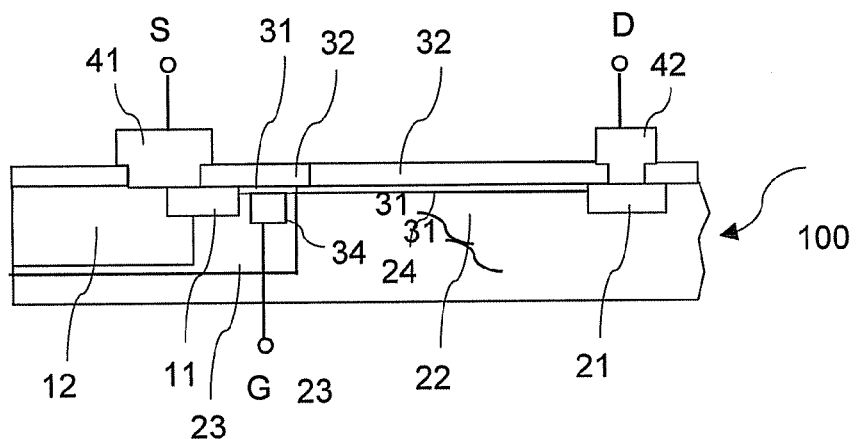
FIG. 17 illustrates a third embodiment of a lateral power transistor component having a control structure according to the second embodiment.

FIG. 17 illustrates a component modified as compared to FIG. 16, where in this component the lower doped semiconductor region 23 of the same doping type as the channel zone 31 only surrounds the gate zone 34 and extends to the connection zone 12. In this component the channel zone 31 and the further channel zone 24—corresponding to the explanations given in connection with the component according to FIG. 16—may be doped differently or may have an equal doping.

Figure 18:
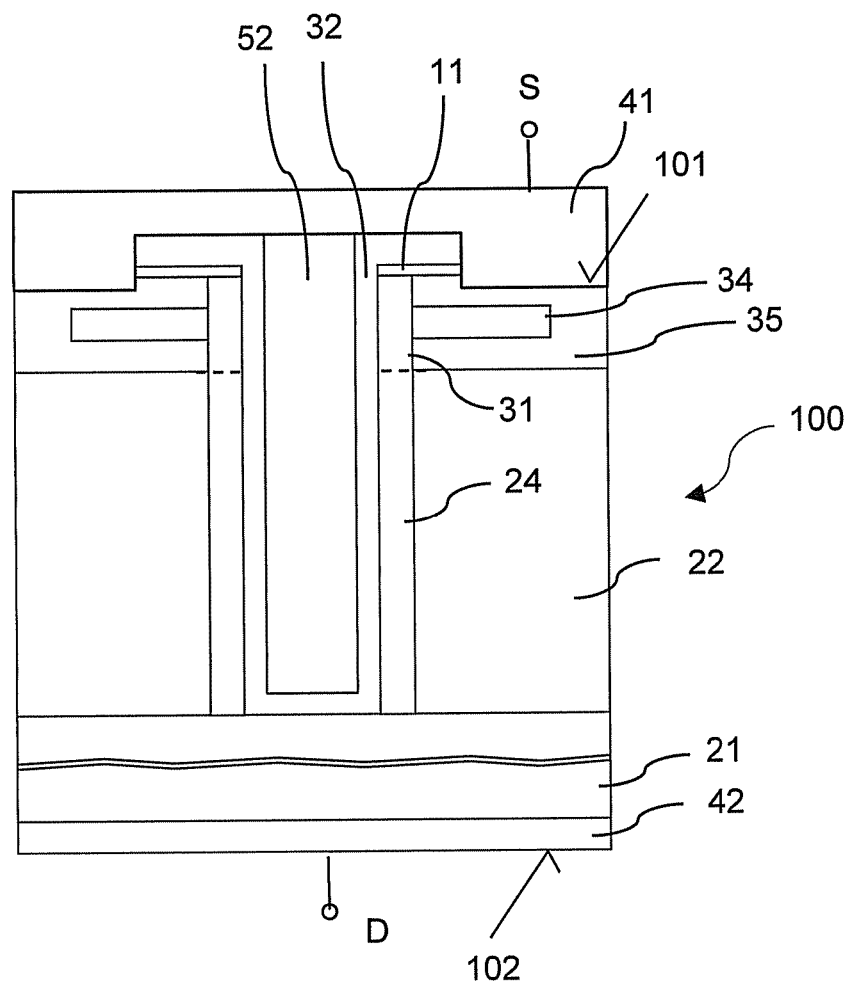
FIG. 18 illustrates an embodiment of a vertical power transistor component having a control structure according to the second embodiment.

FIG. 18 by a cross-section through the semiconductor body illustrates a vertical component having a control structure explained before with reference to FIGS. 13 to 16. In this component the source zone 11 and the drain zone 21 are arranged distant to one another in a vertical direction of the semiconductor body. In this component the channel control layer 32 extends from the source zone 11 to the drain zone 21. Arranged in the drift zone 22 is a further channel zone that is doped complementarily to the drift zone 22, and that is arranged between the channel zone 31 and the drain zone 21 in the current flow direction, i.e. in vertical direction. In this component the channel zone 31 and the further channel zone 24 may be implemented as a common semiconductor zone having an equal doping or having different dopings (illustrated in dashed lines). In this component gate zone 34 is separated from the drift zone 23 as well as from the source zone 11 or the source electrode 41 contacting the source zone 11, respectively, by a semiconductor zone 35 doped complementarily to the gate zone 34.

An example of a method for producing such component will be explained with reference to FIGS. 19A to 19G in the following.

Referring to FIG. 19, in this method first a semiconductor body having a semiconductor layer later forming the drain zone 21, and a semiconductor layer later forming the drift zone 22 is provided. The semiconductor layer forming the drain zone 21 is, e.g., a semiconductor substrate. The semiconductor layer forming drift zone 22 is, e.g., an epitaxial layer arranged on the semiconductor substrate. Referring to FIGS. 19A and 19B, in this method first the gate zone 34 and the doped semiconductor zone 35 surrounding the gate zone 34 are produced. For this subsequently a layer 35A of the conduction type of the complementary semiconductor zone 35, a layer 34' of the conduction type of the gate zone 34, as well as a further layer (not shown) of the doping type of the complementary semiconductor zone 35 are produced. At least in the two semiconductor layers produced first semiconductor regions 35B, 35C are implanted that are of the same conduction type as the complementarily doped semiconductor zone 35, and that border the later gate zone 34 in lateral direction. After depositing all three layers a temperature process is performed through which the dopants from the semiconductor regions 35B, 35C diffuse into the second semiconductor layer 34', with these dopants re-doping those regions in which the gate zone 34 is not to be produced. The result of this method is illustrated in FIG. 19B.

Figure 19A:
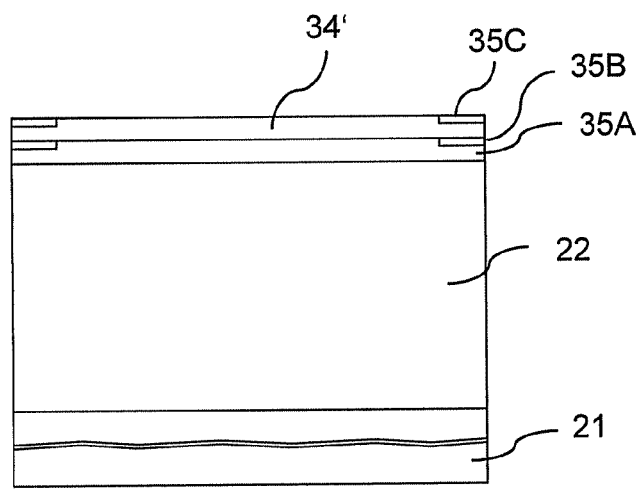
FIG. 19 illustrates an embodiment of a method for producing a component according to FIG. 18.
Figure 19B:
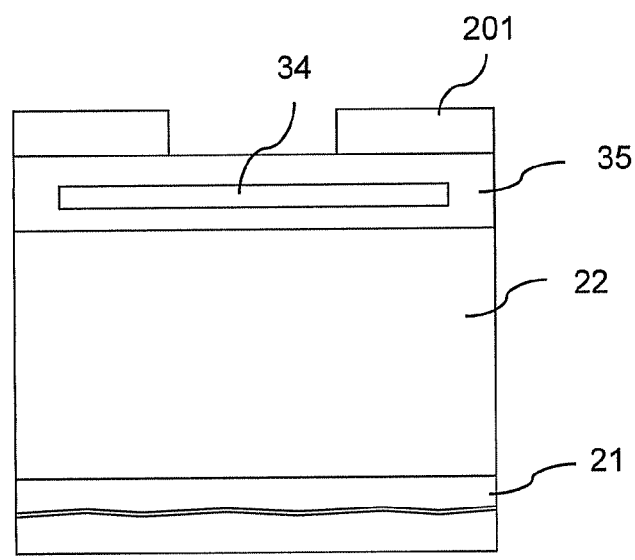
Figure 19C:
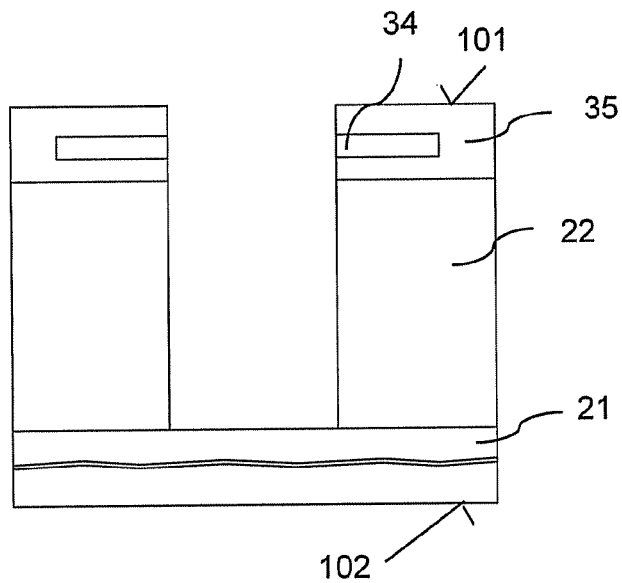

Referring to FIG. 19C, afterwards a trench is produced that extends starting from the first side 101 of the semiconductor body 100 to the drain zone 21. Producing this trench is, e.g., performed using usual etch methods using an etch mask 201 illustrated in FIG. 19B.

Figure 19D:
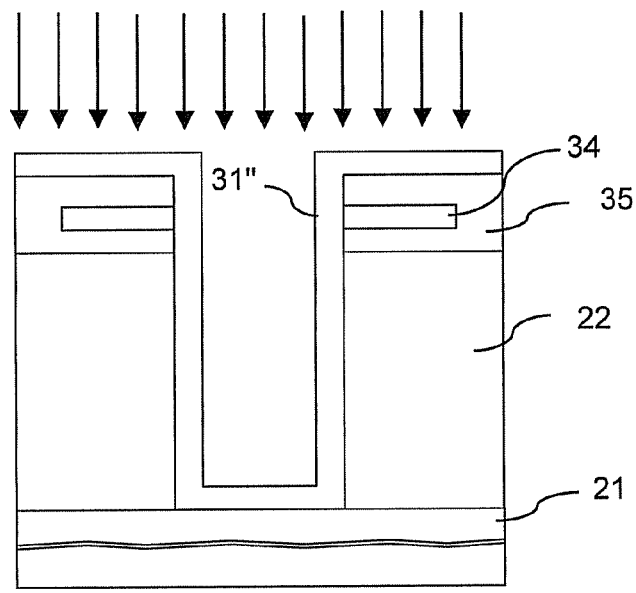

Crystal damages possibly resulting from the trench etching may be removed by a post processing of the semiconductor surface, such as, for example, producing a thermal oxide (sacrificial oxide) and subsequently etching back the oxide. Referring to FIG. 19D, subsequently a semiconductor layer 31" is overall produced, the semiconductor layer 31" forming the later channel zone 31 and the further channel zone 24. This semiconductor layer 31" is, for example, formed by epitaxially depositing a semiconductor material. Subsequently this semiconductor material is removed from the bottom of the trench as well as from the first side 101 of a semiconductor body. For this an anisotropic etching process is suitable. Referring to the result illustrated in FIG. 19E, from this a semiconductor layer 31' results that only remains on the sidewalls of the trench, and that forms the channel zone 31 and the further channel zone.

The semiconductor layers 31' obtained at the sidewalls of the trench due to the explained production process have a same doping concentration along the complete depth of the trench, so that in the later component the channel zone 31 of the control structure and the further channel zone 24 in the drift zone 22 have equal doping concentrations. For producing a channel zone 31 and the further channel zone 24, having different doping concentrations, it is optionally possible to change, in one embodiment to increase, the doping concentration of the semiconductor layer 31' in that region in which it forms the channel zone. For this, dopants may be implanted under an inclined angle compared to the first side of the semiconductor body 100. Due to the inclined implantation angle the dopants in the trench only reach the upper region of the semiconductor layer 31', in which the channel zone 31 is arranged. In one embodiment, before this doping process the trench may be filled with a protection layer up to a level of a boundary between the two channel zones 31, 24, protection layer protecting the further channel zone 24 from being doped. This protection layer is removed after performing the additional doping of the channel zone 32.

Figure 19E:
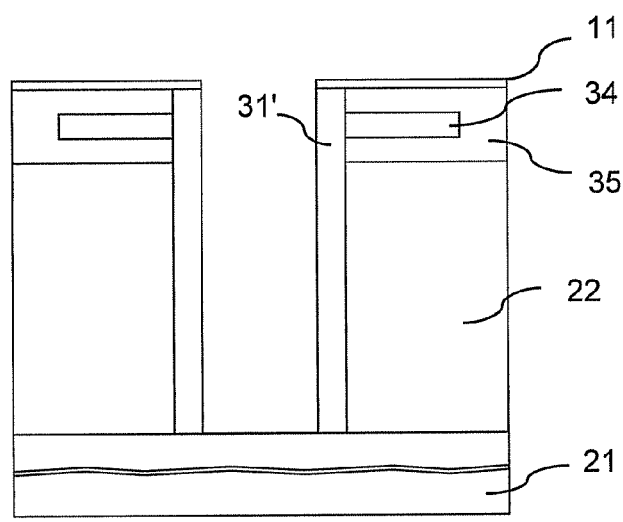

Referring to the result illustrated in FIG. 19E, source zone 11 is produced after producing the channel zone 31. For this, dopants of the same doping time as source zone 11 are, for example, introduced into the semiconductor body via the first side 101. For this, an implantation process is suitable, for example. In an n-conducting component source zone 11 is n-doped. Suitable dopants atoms for producing the n-doped source zone 11 are, for example, arsenic atoms or phosphorous atoms.

Figure 19F:
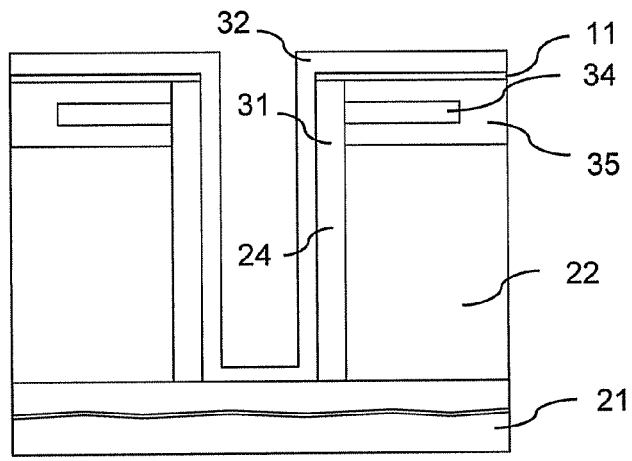

Referring to FIG. 19F the amorphous semi-insulating channel control layer 32 is subsequently formed, i.e. on the sidewalls as well as on the bottom of the trench, and above the first side 101 of the semiconductor body. This amorphous semi-insulating layer 32 is, for example, a DLC layer and may, for example, be produced using the method explained before.

Figure 19G:
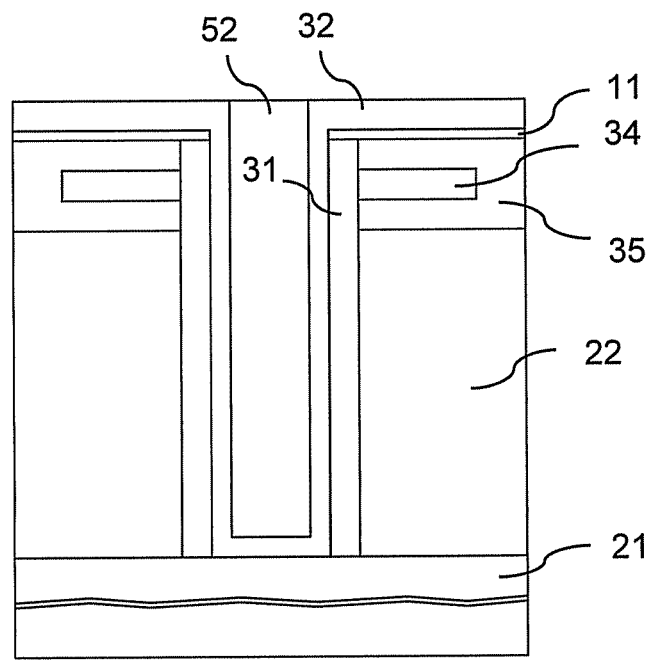

The amorphous semi-insulating channel control layer 32 is, for example, produced such that this layer 32 does not completely fill the trench, but only covers the bottom and the sidewalls of the trench. Referring to FIG. 19G the residual trench remaining through this may be filled with a filling material. This filling material is, for example, an undoped silicon oxide (USG), a polyimide, a silicone, an epoxy material, or benzo-cyclo-buthene (BCB). This filling material 32 is, for example, produced overall using a plasma deposition process, and is subsequently removed above the first side 101. Subsequently contact holes are formed, the contact holes above the first side 101 reaching through the channel control layer 32 into the source zone 11, and into the complementary semiconductor zone 35 surrounding gate zone 34. Subsequently the source electrode 41 is produced above the first side 101, and the drain electrode 42 is produced above the second side 102, resulting in the component illustrated in FIG. 18.

Finally it should be mentioned that features that have been explained in connection with one embodiment may be combined with features of other embodiments, even if this has not explicitly been mentioned.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A transistor component, comprising:
a first and a second connection zone arranged distant to one another; and
a control structure comprising:
a channel zone of a first conduction type arranged in a current flow direction between the first and the second connection zone, the channel zone having a doping concentration;
a channel control layer of an amorphous semi-insulating material extending in a current flow direction along the channel zone, a work function of the material of the channel control layer and the doping concentration of the channel zone adjusted to one another such that only by the presence of the channel control layer an inversion channel develops along the channel zone;
a control electrode contacting the channel control layer; and
a drift zone of a same conduction type as the first connection zone between the channel zone and the second connection zone, the drift zone having a lower doping concentration than the first connection zone.

2. The transistor component of claim 1, wherein the channel control layer is arranged between the channel zone and the control electrode.

3. The transistor component of claim 2, wherein the control electrode is made of a metal, or a doped polycrystalline semiconductor material.

4. The transistor component of claim 1, wherein the channel zone is arranged between the channel control layer and the control electrode.

5. The transistor component of claim 4, wherein the control electrode adjoins the channel zone, and is a doped semiconductor zone of a second conduction type complementary to the first conduction type.

6. The transistor component of claim 4, wherein a doping concentration of the channel zone is selected such that the channel zone may completely be depleted in a direction perpendicular to the current flow direction.

7. The transistor component of claim 1, wherein the channel zone is p-doped, and wherein a work function of the material of the channel control layer and a doping concentration of the channel zone are adapted to one another such that:

$$q\Phi_a > E_g + q\chi - q\psi_s(inv) - (E_F - E_V)$$

$q\Phi_a$ denoting the work function, $E_g$ the band gap of the semiconductor material of the channel zone, $q\psi_s$ (inv)
the contact potential necessary for the onset of a strong inversion, $q\chi$ the electron affinity, $E_F$ the Fermi level, and $E_V$ the energy level of the valance band.

8. The transistor component of claim 7, wherein the channel zone is n-doped, and in which a work function of the material of the channel control layer and a doping concentration of the channel zone are adapted to one another such that:

$$q\Phi_a < q\chi - q\psi_s(inv) + (E_C - E_F)$$

$q\Phi_a$ denoting the work function, $E_g$ the band gap of the semiconductor material of the channel zone, $q\psi_s$(inv) the contact potential necessary for the onset of a strong inversion, $q\chi$ the electron affinity, $E_F$ the Fermi level, and $E_C$ the energy level of the conduction band.

9. The transistor component of claim 1, wherein the channel control layer extends along the drift zone to the second connection zone.

10. A transistor component, comprising:
a first and a second connection zone arranged distant to one another; and
a control structure comprising:
a channel zone of a first conduction type arranged in a current flow direction between the first and the second connection zone, the channel zone having a doping concentration;
a channel control layer of an amorphous semi-insulating material extending in a current flow direction along the channel zone, a work function of the material of the channel control layer and the doping concentration of the channel zone adjusted to one another such that only by the presence of the channel control layer an inversion channel develops along the channel zone; and
a control electrode contacting the channel control layer,
wherein a drift zone of a same conduction type as the first connection zone is arranged between second connection zone and the channel zone,
wherein the channel control layer extends along the drift zone to the second connection zone, and
wherein a further channel zone is arranged in the drift zone, the further channel zone adjoining the channel control zone and being doped complementarily to the drift zone.

11. The transistor component of claim 1, wherein the first and the second connection zone are arranged distant to one another in a lateral direction of the semiconductor body.

12. The transistor component of claim 1, wherein the first and the second connection zones are arranged distant to one another in a vertical direction of a semiconductor body.

13. The transistor component of claim 1, wherein the channel control layer is made of one of the following components: doped or undoped amorphous silicon (aSi), doped or undoped silicone carbide (aSiC), diamond-like carbone (DLC), semi-insulating polysilicon (SIPOS).

14. The transistor component of claim 1, wherein a work function of the material of the channel control layer is between 4.0 eV and 4.20 eV.

15. The transistor component of claim 1, in which a doping concentration of the channel zone is between $10^{13}$ cm$^{-3}$ and $10^{18}$ cm$^{-3}$.

16. The transistor component of claim 1, in which a doping concentration of the channel zone is between $10^{14}$ cm$^{-3}$ and $10^{17}$ cm$^{-3}$.

17. A semiconductor component, comprising:
a first connection zone;
a second connection zone arranged distant from the first connection zone;

a channel zone of a first conduction type arranged in a current flow direction between the first and the second connection zone, the channel zone having a doping concentration;

a channel control layer of an amorphous semi-insulating material extending in the current flow direction and adjoining the channel zone, a work function of the material of the channel control layer and the doping concentration of the channel zone adjusted to one another such that only by the presence of the channel control layer an inversion channel develops along the channel zone;

a control electrode contacting the channel control layer; and a drift zone of a same conduction type as the first connection zone between the channel zone and the second connection zone, the drift zone having a lower doping concentration than the first connection zone.

18. The semiconductor component of claim 17, wherein the channel zone is arranged between the channel control layer and the control electrode.

19. The semiconductor component of claim 17, wherein the channel control layer is arranged between the channel zone and the control electrode.

20. The transistor component of claim 17, wherein the channel control layer extends along the drift zone to the second connection zone.

21. A semiconductor component, comprising:
a first connection zone;
a second connection zone arranged distant from the first connection zone;
a channel zone of a first conduction type arranged in a current flow direction between the first and the second connection zone, the channel zone having a doping concentration;
a channel control layer of an amorphous semi-insulating material extending in the current flow direction and adjoining the channel zone, a work function of the material of the channel control layer and the doping concentration of the channel zone adjusting to one another such that only by the presence of the channel control layer an inversion channel develops along the channel zone; and
a control electrode contacting the channel control layer,
wherein a drift zone of a same conduction type as the first connection zone is arranged between the second connection zone and the channel zone and the channel control layer extends along the drift zone to the second connection zone, and
wherein a further channel zone is arranged in the drift zone, the further channel zone adjoining the channel control zone and being doped complementarily to the drift zone.

22. An integrated circuit having a semiconductor component, comprising:
a first connection zone;
a second connection zone arranged apart from the first connection zone;
a channel zone of a first conduction type arranged in a current flow direction between the first and the second connection zone, the channel zone having a doping concentration;
a channel control layer of an amorphous semi-insulating material extending in the current flow direction along the channel zone, a work function of the material of the channel control layer and the doping concentration of the channel zone adjusted to one another such that only by the presence of the channel control layer an inversion channel develops along the channel zone;
a control electrode configured such that the channel zone is arranged between the channel control layer and the control electrode, the control electrode contacting the channel control layer; and
a drift zone of a same conduction type as the first connection zone between the channel zone and the second connection zone, the drift zone having a lower doping concentration than the first connection zone.

* * * * *

UNITED STATES PATENT AND TRADEMARK OFFICE
CERTIFICATE OF CORRECTION

PATENT NO. : 8,735,981 B2
APPLICATION NO. : 12/486471
DATED : May 27, 2014
INVENTOR(S) : Gerhard Schmidt Page 1 of 1

It is certified that error appears in the above-identified patent and that said Letters Patent is hereby corrected as shown below:

In the Claims

Column 24, line 1, delete "adjusting" and insert in place thereof -- adjusted --.

Signed and Sealed this
Ninth Day of December, 2014

Michelle K. Lee
*Deputy Director of the United States Patent and Trademark Office*